United States Patent [19]

Mizuno et al.

[11] Patent Number: 5,534,072
[45] Date of Patent: Jul. 9, 1996

[54] INTEGRATED MODULE MULTI-CHAMBER CVD PROCESSING SYSTEM AND ITS METHOD FOR PROCESSING SUBTRATES

[75] Inventors: Shigeru Mizuno; Yoshihiro Katsumata; Nobuyuki Takahashi, all of Fuchu, Japan

[73] Assignee: Anelva Corporation, Fuchu, Japan

[21] Appl. No.: 77,687

[22] Filed: Jun. 16, 1993

[30] Foreign Application Priority Data

Jun. 24, 1992 [JP] Japan .................................. 4-190040

[51] Int. Cl.$^6$ ................................... C23C 16/00
[52] U.S. Cl. ................................................. 118/728
[58] Field of Search .................... 118/715, 725, 118/729, 728; 414/217; 29/25.01

[56] References Cited

U.S. PATENT DOCUMENTS

| | | | |
|---|---|---|---|
| 4,496,609 | 1/1985 | McNeilly et al. | 427/55 |
| 4,565,157 | 1/1986 | Brors et al. | 118/719 |
| 4,607,591 | 8/1986 | Stitz | 118/666 |
| 4,629,635 | 12/1986 | Brors | 427/255.2 |
| 4,632,056 | 12/1986 | Stitz et al. | 118/712 |
| 4,632,057 | 12/1986 | Price et al. | 118/719 |
| 4,640,224 | 3/1987 | Bunch et al. | 118/725 |
| 4,715,921 | 12/1987 | Maher et al. | 156/345 |
| 4,726,961 | 2/1988 | Diem et al. | 437/245 |
| 4,741,928 | 5/1988 | Wilson et al. | 427/250 |
| 4,749,597 | 7/1988 | Mendonca et al. | 427/253 |
| 4,796,562 | 1/1989 | Brors et al. | 118/725 |
| 4,817,557 | 4/1989 | Diem et al. | 118/719 |
| 4,817,558 | 4/1989 | Itoh | 118/725 |
| 4,825,808 | 5/1989 | Takahashi et al. | 118/719 |

(List continued on next page.)

FOREIGN PATENT DOCUMENTS

| | | |
|---|---|---|
| 0476676 | 3/1992 | European Pat. Off. . |
| 0476480 | 3/1992 | European Pat. Off. . |
| 61-8153B2 | 3/1986 | Japan . |
| 61-30030B2 | 7/1986 | Japan . |
| 63-238263A | 10/1988 | Japan . |
| 4-225225A | 8/1992 | Japan . |
| 4-345022A | 12/1992 | Japan . |
| 5-21579A | 1/1993 | Japan . |
| WO91/07773 | 5/1991 | WIPO . |

OTHER PUBLICATIONS

Catalogue of Anelva Corp. "In–line Multi–Chamber System 1051", Jul. 1988.

Catalogue of Anelva Corp. "Multi–Chamber Metal CVD System", Jun. 1992.

Technical Proceedings Semicon/West; "Wafer Transport Innovations for Multi–Process Integration"; May 21–23, 1985; Brian Hardegen et al., pp. 51–57.

(List continued on next page.)

*Primary Examiner*—Olik Chaudhuri
*Assistant Examiner*—Brian K. Dutton
*Attorney, Agent, or Firm*—Burns, Doane, Swecker & Mathis

[57] ABSTRACT

In a CVD processing system for depositing a blanket tungsten film, a distinct shadow is formed without causing any micro-peeling when the substrate fixture is separated from the substrate so as to prevent any blanket tungsten from being deposited on $SiO_2$, thus reducing the occurrence of fine dust particles. A CVD processing system for depositing a blanket tungsten film, includes a susceptor (4); a ring chuck (9) for affixing the peripheral portion of a substrate (3) on the susceptor; reactive gas supply mechanisms (17, 18 and 19) for supplying reactive gas; and an exhaust mechanism (2) for exhausting unreacted gas and the like, wherein: the ring chuck has at least three point contact members (10) in contact with the peripheral portion of the substrate; the point contact members are provided at positions outside the inner periphery of the ring chuck; a gap (11) is formed at the point contact members between the ring chuck and the substrate; and purge gas supply mechanisms (20 and 21) are provided to blow off purge gas through the gap in order to prevent reactive gas from entering the gap (11). A ratio of the size of the gap to the flow rate of purge gas is set to such an optimum value as to satisfy a condition in which the position of the peripheral portion of the thin film coincides with the position of the inner periphery of the ring chuck.

59 Claims, 17 Drawing Sheets

U.S. PATENT DOCUMENTS

| | | | |
|---|---|---|---|
| 4,836,138 | 6/1989 | Robinson et al. | 118/666 |
| 4,920,908 | 5/1990 | Brors et al. | 427/255.2 |
| 4,923,715 | 5/1990 | Matsuda et al. | 427/237 |
| 4,951,601 | 8/1990 | Maydan et al. | 118/719 |
| 4,956,204 | 9/1990 | Amazawa et al. | 427/248.1 |
| 4,957,777 | 9/1990 | Ilderem et al. | 427/55 |
| 4,978,412 | 12/1990 | Aoki et al. | 118/728 |
| 4,994,301 | 2/1991 | Kusumoto et al. | 427/56.1 |
| 5,000,113 | 3/1991 | Wang et al. | 118/723 |
| 5,013,385 | 5/1991 | Maher et al. | 156/345 |
| 5,033,407 | 7/1991 | Mizuno et al. | 118/725 |
| 5,043,299 | 8/1991 | Chang et al. | 437/192 |
| 5,063,031 | 11/1991 | Sato | 422/245 |
| 5,076,205 | 12/1991 | Vowles et al. | 118/719 |
| 5,091,208 | 2/1992 | Pryor | 427/38 |
| 5,094,885 | 3/1992 | Selbrede | 118/715 |
| 5,102,495 | 4/1992 | Maher et al. | 156/643 |
| 5,108,569 | 4/1992 | Gilboa et al. | 204/192.13 |
| 5,108,779 | 4/1992 | Gasworth | 427/39 |
| 5,123,375 | 6/1992 | Hansen | 118/715 |
| 5,133,284 | 7/1992 | Thomas et al. | 118/719 |
| 5,147,498 | 9/1992 | Nashimoto | 118/725 |
| 5,158,644 | 10/1992 | Cheung et al. | 156/643 |
| 5,160,544 | 11/1992 | Garg et al. | 118/724 |
| 5,169,685 | 12/1992 | Woodruff et al. | 427/250 |
| 5,175,017 | 12/1992 | Kobayashi et al. | 427/8 |
| 5,183,402 | 2/1993 | Cooke et al. | 432/5 |
| 5,186,594 | 2/1993 | Toshima et al. | 414/217 |
| 5,186,718 | 2/1993 | Tepman et al. | 29/25.01 |
| 5,203,956 | 4/1993 | Hansen | 156/643 |
| 5,230,741 | 7/1993 | van de Ven et al. | 118/728 |
| 5,242,501 | 9/1993 | McDiarmid | 118/728 |
| 5,304,248 | 4/1994 | Cheng et al. | |
| 5,326,725 | 7/1994 | Sherstinksy et al. | |
| 5,332,442 | 7/1994 | Kubodera et al. | 118/728 |

OTHER PUBLICATIONS

Semiconductor World; Nov. 1991 pp. 344–345 "Model 6000 Series" of Genus Inc.

Semiconductor world; Nov. 1991 pp 346–347 "Precsion 5000 WCVD" of Applied Materials Inc.

Semiconductor World; Nov. 1991 pp. 348–349 Concept One–W of Novellus Systems, Inc.

Semiconductor World; Nov. 1991 pp. 350–351 ERA–2000 of ULVAC Japan Ltd.

Semiconductor World; Nov. 1991 pp. 352–353 C7000 of TEL–Varian Ltd.

Semiconductor World; Nov. 1991 pp. 354–355 ILC 1060M–CVD.

Technical Proceedings Semicon West; Multichamber System for Chemcial Vapor Deposition Method; Tetsuo Ishida et al.; pp. 83–90; Jun. 1990.

Technical Proceedings Semicon West; Selective CVD–W Utilizing $SiH_4$ Reduction; Kenji Numajiri et al.; pp. 66–77; Nov. 1989.

Max.-Min. ±3.7%

Two semicirular lamps

Max.-Min. ±7.6%

Micro Peeling (×50)

Shadow Line (×50)

σ/X : 3.3%
Max-Min : ±6.1%

| Maintenance \ Chamber | 1st | 2nd | ... | Nth |
|---|---|---|---|---|
| P(1) | $W_m-(1-1)W_c$ | $W_m-(1-1)W_c+(W_m+W_c)(2-1)$ | ......... | $W_m-(1-1)W_c+(W_m+W_c)(N-1)$ |
| P(2) | $W_m-(2-1)W_c$ | $W_m-(2-1)W_c+(W_m+W_c)(2-1)$ | ......... | $W_m-(2-1)W_c+(W_m+W_c)(N-1)$ |
| P(3) | $W_m-(3-1)W_c$ | $W_m-(3-1)W_c+(W_m+W_c)(2-1)$ | ......... | ......... |
| ... | ... | ... | ... | ... |
| P(k) | $W_m-(k-1)W_c$ | $W_m-(k-1)W_c+(W_m+W_c)(2-1)$ | ......... | $W_m-(k-1)W_c+(W_m+W_c)(N-1)$ |
| ... | ... | ... | ... | ... |
| P(n) | $W_m-(n-1)W_c$ | $W_m-(n-1)W_c+(W_m+W_c)(2-1)$ | ......... | $W_m-(n-1)W_c+(W_m+W_c)(N-1)$ |

FIG. 25(a)

INTEGRATED MODULE MULTI-CHAMBER CVD PROCESSING SYSTEM AND ITS METHOD FOR PROCESSING SUBTRATES

BACKGROUND OF INVENTION

1. Field of Invention

The present invention relates to an apparatus for performing a chemical vapor deposition (CVD) process in a semiconductor manufacturing process, and more particularly, for an integrated module multi-chamber CVD processing system. Furthermore, the present invention relates to a substrate processing method using the integrated module multi-chamber CVD processing system.

2. Description of Related Art

Recently, in the fabrication of semiconductors, highly integrated and finely integrated circuits of semiconductor devices have been developed. With such developments, to improve the reliability of semiconductor devices, wiring for forming semiconductor circuits plays an important role. Especially, with fine wiring for semiconductor devices, sufficient electric conductivity properties for the wiring are needed. Since fine wiring increases the current density of current flowing through it, electromigration occurs easily, causing a disconnection in the wiring. An Al film serving as the wiring material is formed by a sputtering method. In this method, step coverage is deteriorated in a fine contact hole. The film thickness on the bottom and sidewalls in the contact hole is much thinner than that on a flat surface. As a result, disconnection occurs more easily for the wiring on the bottom and sidewalls in the contact hole. Accordingly, this method causes a deterioration in the reliability of the semiconductor devices.

To form wiring around such a fine contact hole, other film deposition techniques are being widely used in place of the Al film deposition by the conventional sputtering method. One of those other techniques is a technique for forming a W film (hereafter called "blanket tungsten") using a chemical vapor deposition method (the so-called "thermal CVD method"). This method is currently getting a lot of attention. Accordingly to the chemical vapor deposition method, $WF_6$ (6-tungsten fluoride) as a raw gas, and $H_2$ as a reducing gas (a reducing agent) are conducted into a reaction vessel, the pressure within the reaction vessel is set to 10 to 100 Torr, and the $WF_6$ reacts with the $H_2$ on a substrate that is usually heated at 400° to 500° C. to form a W film on the substrate. Usually, this chemical reaction is necessary to be performed on the condition that the film deposition rate is dependent on the substrate temperature, that is, an elementary process on the substrate is a reaction rate-determining step.

Due to this method, a W film with a uniform film thickness can be formed even within a fine contact hole having an aperture diameter of 0.5 μm and an aspect ratio (ratio of depth to width) of 2 or higher with respect to step coverage. In addition, the W film also has high resistance to electromigration with respect to the material characteristics. Therefore, it is capable of forming wiring with very high reliability, even if the wiring is fine.

An apparatus for depositing such a W film on a substrate will be described hereafter.

FIG. 9 is a schematic view showing a conventional CVD processing apparatus for forming a blanket W film using the thermal CVD method.

A substrate (3) is placed on a substrate holder (4), which is heated by lamp heaters (5) located behind the holder. The substrate, is fixed by mechanically pressing the edge of the substrate (3) by a vertically movable substrate fixture (9).

The temperature of the substrate holder (4) is measured and controlled by a thermocouple (6). The substrate (3) is placed on the substrate holder (4), which is set at a desired temperature. The substrate (3) is fixed on the substrate holder (4) by the substrate fixture (9). Reactive gas is conducted into the apparatus through the gas blow-off portion (17) located opposite the substrate (3) so as to form a desired thin film on the substrate (3) by a chemical reaction. The unreacted gas and by-product gas are expelled through an exhaust portion (2). Also, according to the technique disclosed in the specification of U.S. Pat. No. 5,033,407, purge gas (Ar gas) is conducted through a lower nozzle to prevent any film from being deposited on silica windows, and the side and back of the substrate (3).

However, the blanket W film as wiring material needs a TiW film or a TiN film as an adhesion layer on the ground. The TiW film or TiN film is formed by sputtering in a pretreatment process for the blanket W film. Here, however, no TiN or TiW film is deposited, owing to the shadow of the ring chuck used in the sputtering process, on the edge portion of the substrate. $SiO_2$, the ground material, remains exposed on the edge portion.

If a blanket W film is deposited on the $SiO_2$, it is apt to be peeled off in a short time after completion of the W film deposition because of the low adhesion between the blanket W film and $SiO_2$. Unwanted peeling causes contamination due to dust particles in a reactor. Furthermore, dust particles generated in the reactor contaminate the whole substrate transfer system, resulting in a contamination of all vacuum chambers within the apparatus. Dust particles lessen productivity of the semiconductor manufacturing and lower the yield of semiconductor devices considerably.

Therefore, in the deposition process of the blanket W film, the $SiO_2$ portion must be covered to prevent W film from being deposited on it. For this reason, for the deposition process of the blanket W film, the shape of the ring chuck must match that of the ring chuck for the sputtering process. Accordingly, the inner diameter of the ring chuck for the blanket W film deposition was designed smaller than that of the ring chuck for the sputtering process. In addition, a contact member of the ring chuck is designed to be in close contact with the entire surface of the substrate edge portion. With the close contact between the contact member of the ring chuck and substrate, reactive gas is prevented from coming into contact with the $SiO_2$ portion, thereby preventing any W film from being deposited on the $SiO_2$.

Here, the edge portion of the substrate is covered with a ring chuck to prevent any film from being deposited on the edge portion of the substrate with a certain width. Limiting the film deposition area in this way is called shadow formation. Also, a certain width of the edge portion of the substrate in which no film is deposited is called a shadow.

However, the conventional apparatus described above has the following problems:

When a W thin film is deposited by the chemical reaction of $WF_6$ with $H_2$, since the deposition rate greatly depends on the substrate temperature, the thickness uniformity of the W film to be deposited on the substrate is determined by the substrate temperature distribution. Therefore, to attain good thickness uniformity of the W film, the substrate temperature distribution must be even. Since, however, substrate fixture (9) is in contact along the edge of a substrate (3) in the above conventional apparatus, heat transfers from the substrate (3) to the substrate fixture (9) through the contact portion.

Therefore, the escape of a large amount of heat from the edge portion of the substrate to the substrate fixture (9) results in a considerable drop in temperature in the vicinity of the edge of the substrate. Thus, the uniform thickness across the W film on the entire surface of the substrate is not attainable.

FIG. 13 is a view showing the sheet resistivity distribution for a W film deposited in a conventional apparatus along the radial direction of the substrate. Since the sheet resistivity is in inverse proportion to the film thickness, FIG. 13 shows that the higher the sheet resistivity of the W film is, the thinner the film thickness of the W film is. Accordingly, this means that the temperature of the substrate is lower, and therefore, the deposition rate is lower, in a place where the sheet resistivity of the W film is higher. On the contrary, the lower the sheet resistivity of the W film is, the thicker the film thickness of the W film is, and therefore, this means that the temperature is higher, and thus the deposition rate is higher in the place where the sheet resistivity is lower.

As seen in FIG. 13, the rise in the sheet resistivity in the vicinity of the edge of the substrate is noticeable, and it can be said that the temperature in the vicinity of the edge of the substrate is lower, therefore, the film thickness is thinner than that in the vicinity of the center of the substrate. Also, the temperature distribution on the substrate (3) is sensitively responsive to that of the substrate holder (4). The temperature distribution on the substrate holder (4) is sensitively responsive to the irradiation distribution of lamp heaters (5) behind the substrate holder (4). Thus, if the irradiation distribution is nonuniform due to a nonsymmetrical lamp heater or a discontinuous lamp heater, such as a circular heater used in the conventional apparatus in FIG. 9, the temperature distribution on the substrate holder (4) becomes uneven, and thereby, the temperature distribution on the substrate (3) also becomes uneven. As a result, the thickness across the W film on the entire substrate surface becomes uneven. Also, even if uniform light irradiation from a lamp heater is applied, the temperature distribution on the surface of the substrate may not be uniform resulting from the positional relationship between the lamp heaters (5) and substrate (3), and the contact position of the substrate (3) with the substrate fixture (9). Even if uniform light irradiation from the lamp heaters could be attained, the uniform thickness across the W film on the entire substrate surface cannot be attained. Yet, in this case, it is necessary that by exposing the interiors of the reaction vessel (reactor) to the atmosphere, the positional relationship between the lamp heaters and the substrate (3), or the contact positional relationship between the substrate (3), substrate holder (4) and substrate fixture (9) is adjusted continuously.

FIG. 12 represents a contour map for the sheet resistivity distribution for a W film deposited on the substrate (3) in a conventional apparatus. Each contour line represents a constant level of sheet resistivity. To easily understand the relationship between the arrangement of the two semicircular lamp heaters and the sheet resistivity distribution, the arrangement of the semicircular lamp heaters is shown on the left side of the sheet resistivity lines. As can be easily understood from FIG. 12, the sheet resistivity is higher where the irradiation distribution from semicircular lamp heaters is not continuous in the conventional apparatus. For this reason, FIG. 12 shows that the temperature of the substrate is lower at a place where the sheet resistivity is higher.

On the other hand, the sheet resistivity is low at the bottom of the semicircular lamp heaters. Thus, it shows that the temperature of the substrate is higher where the sheet resistivity is lower. This demonstrates that the substrate temperature distribution as mentioned above greatly depends on the shape of the lamp heaters and the arrangement of lamp heaters, and therefore, the thickness across the film becomes uneven throughout the entire substrate surface.

Also, in such a conventional CVD processing apparatus as shown in FIG. 9, when a substrate (101) is fixed with a substrate fixture (102) to deposit a thin film on the substrate (101), as shown in FIG. 10, a thin film (201) is also deposited on the surface of the substrate fixture (102) which is in contact with the substrate (101). Furthermore, the thin film (201) is deposited continuously extending to the contact portion (104) of the substrate fixture (102) from the substrate (101).

For this reason, when the substrate fixture (102) is separated from the substrate (101) after the thin film depositing process has been completed, fine small pieces (202) are produced as a result of the peeling off of the thin film, as seen in FIG. 11. In other words, micro-peeling occurs and results in the production of dust particles. When the substrate fixture (102) is lifted, dust particles produced by micro-peeling drop down on the substrate (101). The dust particles caused by the micro-peeling become a major factor decreasing the production yield of semiconductor devices. The occurrence of dust particles is a serious problem as regards quality control during the manufacturing of semiconductors. FIG. 14 is an optical microphotograph showing that micro-peeling occurs on the edge portion of the region of the blanket W thin film deposited on a substrate by the conventional apparatus shown in FIG. 9.

Also, if a thin film is deposited continuously extending over the entire substrate and the contact portion between the substrate and the substrate fixture, and even if the substrate fixture comes into contact with the substrate at only one position, micro-peeling will occur, thus producing dust particles. In the CVD processing apparatus disclosed in U.S. Pat. No. 5,094,885, as easily understood from FIG. 3, which shows the contact between the substrate and clamp ring, micro-peeling occurs at several places, thus producing dust particles.

The time for deposition of a blanket tungsten film by the CVD process requires about 4 to 5 minutes. Since the deposition time in the CVD method requires about four to five times as long as that in the magnetron sputtering method, the throughput cannot be improved in a single wafer processing type CVD apparatus.

Therefore, such batch processing type CVD apparatuses as disclosed in U.S. Pat. Nos. 5,094,885 and 5,113,284 are used to deposit blanket W film. In the batch processing type CVD apparatus, however, dust particles which are produced in each of several processing stations provided within one vacuum vessel contaminate other processing stations. For this reason, the production yield for semiconductor devices cannot be improved. Furthermore, the inside of the reaction vessel is usually cleaned as one of the maintenance operations for the CVD processing apparatus. In the batch processing type CVD apparatus, when the inside of the vacuum vessel, where several processing stations are provided, is cleaned, the depositing process for a blanket W film is suspended.

Since the batch processing type reaction vessel has a larger capacity than the single wafer processing type reaction vessel, it requires more labor for cleaning, resulting in a much longer maintenance time than the latter type. Thus, in the batch processing type CVD processing apparatus, the working efficiency per week or month decreases. The resultant throughput per week or month cannot be improved. Therefore, for a blanket W film depositing process, a single wafer processing type CVD processing system is used having such a self-cleaning mechanism as disclosed in U.S. Pat. No. 5,158,644. However, in the single wafer processing type CVD processing apparatus having this self-cleaning mechanism (plasma cleaning), two processes are performed: the thin film depositing process and a cleaning process. Therefore, time for depositing thin film for a wafer requires more than twice the time for only depositing the W film. The resultant throughput cannot be improved even by this type.

SUMMARY OF THE DISCLOSURE

It is an object of the present invention to improve the production yield for semiconductor devices, and to improve the throughput for a thin film depositing process.

It is also an object of the present invention to provide a thin film depositing apparatus capable of minimizing the occurrence of dust particles, and to attain a high yield in a semiconductor device manufactured by preventing the substrate temperature distribution resulting from the lamp heaters, substrate holding base, and substrate fixture, which are conventional problems, from becoming nonuniform, and by eliminating micro-peeling which occurs when the substrate fixture is lifted from the substrate.

Another object of the present invention is to improve the throughput for a thin film depositing process by continuously carrying out the thin film depositing process by continuously performing a thin film depositing process in reaction vessels, even if maintenance work is done in another reaction vessel while preventing contamination of the dust particles between reaction vessels by the use of the integrated module multi-chamber vacuum processing system.

Thus, the CVD processing apparatus, for depositing a blanket tungsten film according to the present invention, has the objectives of attaining good thickness uniformity; preventing micro-peeling; preventing any occurrence Of dust particles other than micro-peeling; improving the throughput of the processing substrates; and reducing the work load required for maintenance work.

The objectives of the present invention are effected by one or more of the following embodiments, either by themselves, or in various combinations with each other. The following embodiments are representative of various features of the present invention, and are not to be construed as limitations of the scope of the present invention.

A substrate is fixed to a substrate holding base within a reaction vessel by allowing a ring-shaped member to come into contact with the edge of the substrate with a plurality of point-contact members. The diameter of an inner circle of the ring-shaped member is designed so as to be smaller than the diameter of the substrate to be fixed with the ring-shaped member so that a portion of the ring-shaped member overhangs in a canopy-like fashion the outer edge of the substrate.

A stepped area is provided on the surface of the substrate holding base for mounting the substrate, in which the substrate holding base is in contact with the substrate. The range (the radius if circular, the inside and outside diameters if doughnut-shaped) and the depth of the stepped area to be provided are determined according to the difference between the average temperature of the substrate and the temperature of the substrate holding base. Since the amount of heat transfer in the noncontact area is less than in the contact area, the temperature of the substrate corresponding to the region where the stepped region is provided drops. Thus, it is possible to lower the temperature of the substrate in the vicinity of the area corresponding to the stepped region.

A plurality of heating mechanisms are provided outside the reaction vessel, which is also termed "a reactor". Each of these heating mechanisms preferably has an independent power control mechanism of its own, and each of the heating mechanisms is preferably positioned behind the substrate. In particular, the heating mechanism is preferably located in the vicinity of the contact portion between the substrate and ring-shaped member. As the optimum heating mechanism to be used outside the reaction vessel, a lamp heater is the most suitable.

There is preferably formed within the ring-shaped member a passage for a heating medium. The ring-shaped member is heated by circulation of the heating medium within the ring-shaped member. The temperature of the heating medium is set to a temperature required to deposit a thin film by the CVD process. If such a required temperature is exceeded, it will promote deposition of a thin film on the surface of the ring-shaped member. It is desirable that the temperature of the heating medium not be 200° C. or higher, because if so, it would promote deposition of a W film on the ring-shaped member.

The reaction vessel has a window made of light-transmissive material. Within the reaction vessel, a substrate holder is located at a position opposite the window. Within the reaction vessel, there are formed passages in which purge gas flows between the window and the substrate holder, between the substrate holder and the ring-shaped member, and between the ring-shaped member and the substrate. The purge gas is heated by the plurality of heating mechanisms provided outside the reaction vessel. Thus, it is possible to prevent the reactive gas from getting into the gap between the substrate and the ring-shaped member by the purge gas when a blanket W film is being deposited on the surface of the substrate. Moreover, by adjusting the flow rate of the purge gas, it is possible to restrict the thin film deposition region so that the edge portion of the deposition region substantially coincides with the inner circle of the ring-shaped member. Thereby, the reactive gas does not reach the point-contact members which are in contact with the substrate. As a result, no thin film is deposited continuously extending over the substrate and onto the point contact portion. No micro-peeling occurs, nor are any fine dust particles produced. Also since a shadow region having a distinct width has been formed, the deposition region does not reach the exposed $SiO_2$ surface.

A portion of the ring-shaped member will be exposed to the reactive gas and other portions. To prevent film that is deposited on such exposed portions from being peeled off, the material of the exposed portions of the ring-shaped member facing the space where the chemical reaction occurs is made of the same material as that of the thin film to be deposited on the substrate. A cause of peeling off of the W film deposited there is an internal stress generated by the difference in thermal expansion between the ring-shaped member and the W film deposited on it. When the W film deposited on the ring-shaped member grows to such a film thickness as to generate internal stress due to the difference in thermal expansion between the ring-shaped member and the W film deposited on it, peeling off occurs. The peeling off of small pieces as dust particles causes the yield to be decreased. Alternatively, it may be possible to use material for the exposed portion of the ring-shaped member that has the same thermal expansion coefficient as the film to be deposited.

In order to prevent particles from one reaction vessel from contaminating other reaction vessels, as the basic arrangement design for an integrated module multi-chamber vacuum processing system, there is provided a vacuum vessel for transferring substrates, and in the vicinity thereof, a plurality of processing vacuum (reaction) vessels, and a load/unload vacuum vessel. The vacuum vessel for transferring substrates is provided with a substrate transferring mechanism. Between each of the processing vacuum vessels, the load/unload vacuum vessel for carrying in and out, and the vacuum vessels for transferring substrates, gate valves are provided for opening and closing. Moreover, within each of the processing vacuum vessels, a substrate is processed. Also, a vacuum pump is provided for each.

In this integrated module multi-chamber vacuum processing system, a substrate is transferred into one processing vacuum vessel, a gate valve between the processing vacuum vessel and vacuum vessel for transferring substrate is closed, the substrate is processed in the processing vacuum vessel. The processed substrate is then taken out and restored into the load/unload vacuum vessel to close the gate valve.

In one processing vacuum vessel, the above procedures are one working process. Throughout this period of time, the gate valves for the other processing vacuum vessels remain closed. According to these processing conditions, dust particles existing within one processing vacuum vessel do not contaminate the other processing vacuum vessels. Also, during this period, even if the gate valve is closed to isolate the processing vacuum vessel from the vacuum vessel for transferring substrate, it is possible to set an appropriate pressure within each of the processing vacuum vessels because each is preferably provided with a vacuum pump.

Usually, a process for completing blanket W films requires TiN deposition, W film deposition and etchback processes. Among these processes, the W film deposition process requires the longest time, that is, about four to five times longer than the processing time required for the TiN deposition and etchback processes. Thus, if the TiN deposition and etchback processes are performed by another thin film depositing system, and only the W film deposition process is performed by the integrated module multi-chamber CVD processing system, in which all processing vacuum vessels are of CVD processing module, the number of substrates for depositing blanket W film will be able to be increased.

Moreover, by the use of a transferring robot capable of storing at least two substrates, it is possible to unite a working process for transferring a processing substrate to a load/unload vacuum vessel, and a working process of transferring an unprocessed substrate to it into one working process. The substrate transferring mechanism specified in U.S. patent application Ser. No. 07/979,255 filed on Nov. 20, 1992 is the most preferred.

An integrated module multi-chamber CVD processing system is used according to a substrate processing method, wherein there are two processes: during maintenance work for one processing vacuum vessel, a CVD process is performed for a substrate in another processing vacuum vessel. An example of this is illustrated in FIG. 25 (a) and FIG. 25 (b).

A circuit is provided on the outside wall of each reaction vessel. This circuit is connected to a circulating pump having a temperature adjusting mechanism, which adjusts the temperature of the heating medium which flows through the circuit. The range of setting temperature for the heating medium is not lower than the temperature of the saturated vapor pressure of the by-product which is produced by the CVD reaction, and not higher than the temperature at which a thin film starts to be deposited by the CVD reaction. If the heating medium temperature of which has been set within this range is circulated in the circuit, the temperature at the inside wall of the reaction vessel will be within the range of the setting temperature. Particles (molecules) of the by-product are difficult to adhere to the inside wall of the reaction vessel because the temperature at the inside wall is higher than the temperature of the saturated vapor pressure of the by-product.

Moreover, if the temperature at the inside wall of the reaction vessel is lower than the temperature at which a thin film starts to be deposited by the CVD reaction, there is no possibility that a thin film is deposited on the inside wall. For this reason, the work load for cleaning the inside wall of the reaction vessel is reduced. For the heating medium, water or oil is most preferable.

The ring-shaped member includes an exposed portion which is exposed to the reactive gas, and other portions. Thus, a film due to the CVD reaction will be deposited only on the surface of the portion exposed to the reactive gas. On cleaning the ring-shaped member, only the portion exposed to the reactive gas need be replaced.

BRIEF DESCRIPTION OF THE DRAWINGS

The file of this patent contains at least one drawing executed in color. Copies of this patent with the color drawings will be provided by the Patent Trademark Office upon request and payment of the necessary fee.

DETAILED DESCRIPTION OF THE PREFERRED EMBODIMENTS

Now, hereafter, the preferred embodiments of the present invention will be described in conjunction with the attached drawings. The drawings only show schematically the shape, size and arrangement of each of the constituent elements to such a degree that the present invention could be understood.

Figure 1:
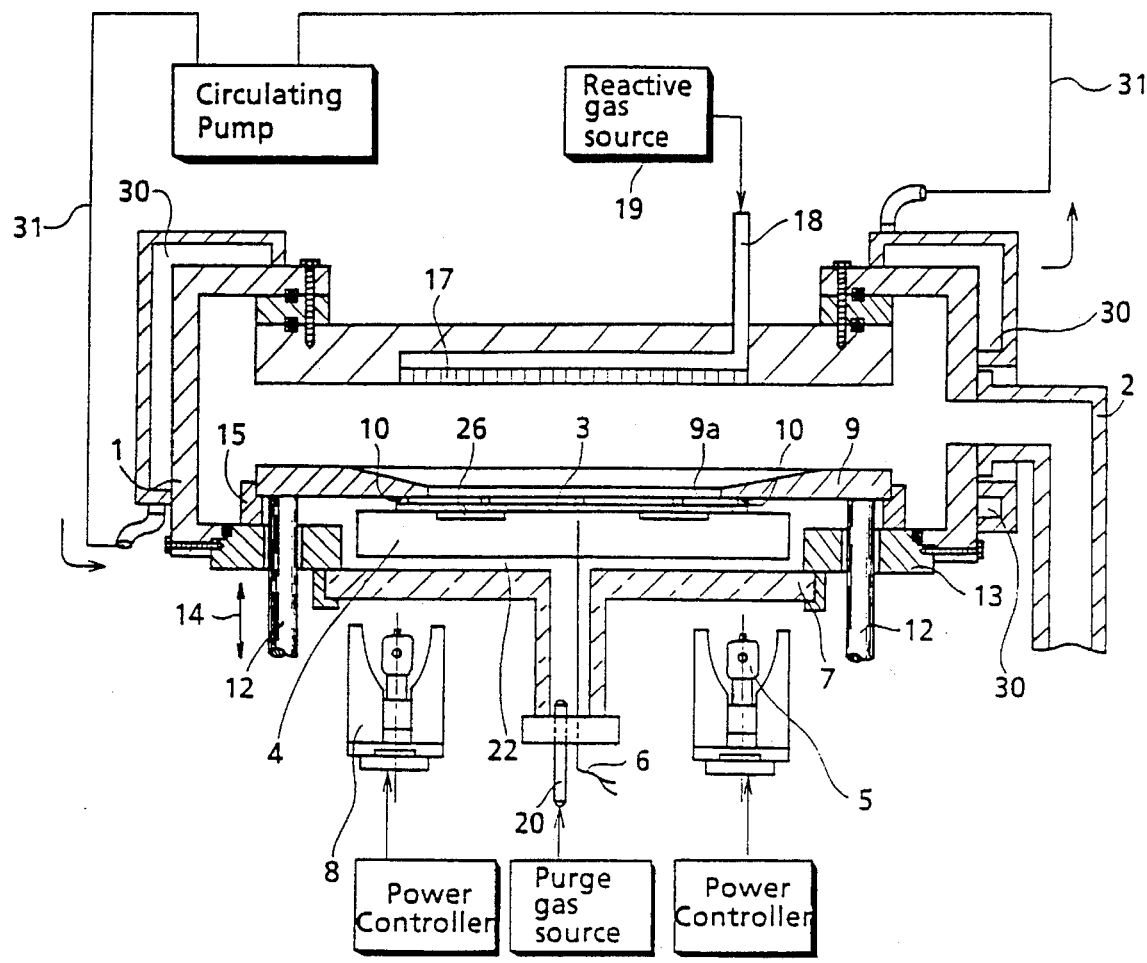
FIG. 1 is longitudinal sectional view showing a CVD processing system according to a preferred embodiment of the present invention.

FIG. 1 shows the overall structure of a CVD processing apparatus according to the present invention. In FIG. 1, a reaction vessel (1), sometimes referred to as vacuum vessel, is air tightly constituted, and the inner space within the reaction vessel (1) is maintained at a predetermined reduced pressure state by an exhaust mechanism (not shown). The space within the reaction vessel (1) serves as the reaction space.

On the outside wall of the reaction vessel (1), a circulating passage (30) is provided in which a heating medium to heat the wall of the reaction vessel is circulated. Piping (2) connected to the reaction vessel (1) is an exhaust tube connected to the exhaust mechanism. In the reaction vessel (1), a substrate (3) is provided. The substrate (3) is mounted and affixed to a susceptor (4) provided in the center within the reaction vessel (1).

The susceptor (4) is heated by lamp heaters (5) located below it and outside the reaction vessel and maintained at a required temperature. The temperature of the susceptor (4) is measured by a thermocouple (6). The temperature data of the susceptor (4) measured by the thermocouple (6) are supplied to a power controller. Through the power controller, electric power applied to the lamp heaters (5) is adjusted on the basis of the foregoing temperature data to control the radiation heat to be irradiated from the lamp heaters (5), thus maintaining the susceptor (4) at a desired temperature.

A silica window (7), made of light-transmitting material, is provided between the susceptor (4) and the lamp heaters (5). The silica window (7) transmits light from the lamp heaters (5) to heat the susceptor, and at the same time, functions to keep the reaction chamber airtight. A reflective member (8), is used to reflect heat irradiated from the lamp heaters (5) to the susceptor (4).

A lamp heater (5) and a reflective member (8) make up a pair, and two pairs are arranged on a concentric circle at an equal pitch. Each of these lamp heaters has its own power controller for controlling the electric power separately.

On the surface of the susceptor (4) in contact with the substrate (3), a doughnut-shaped stepped area with a certain depth is machined. If, however, the substrate (3) has orientation flat (the so-called "orifla"), the outside edge of the step-machined region is in parallel with the orifla line in the vicinity of the orifla so that the outside edge of the step-machined region stays at a constant distance from the edge of the substrate (3).

Figure 2:
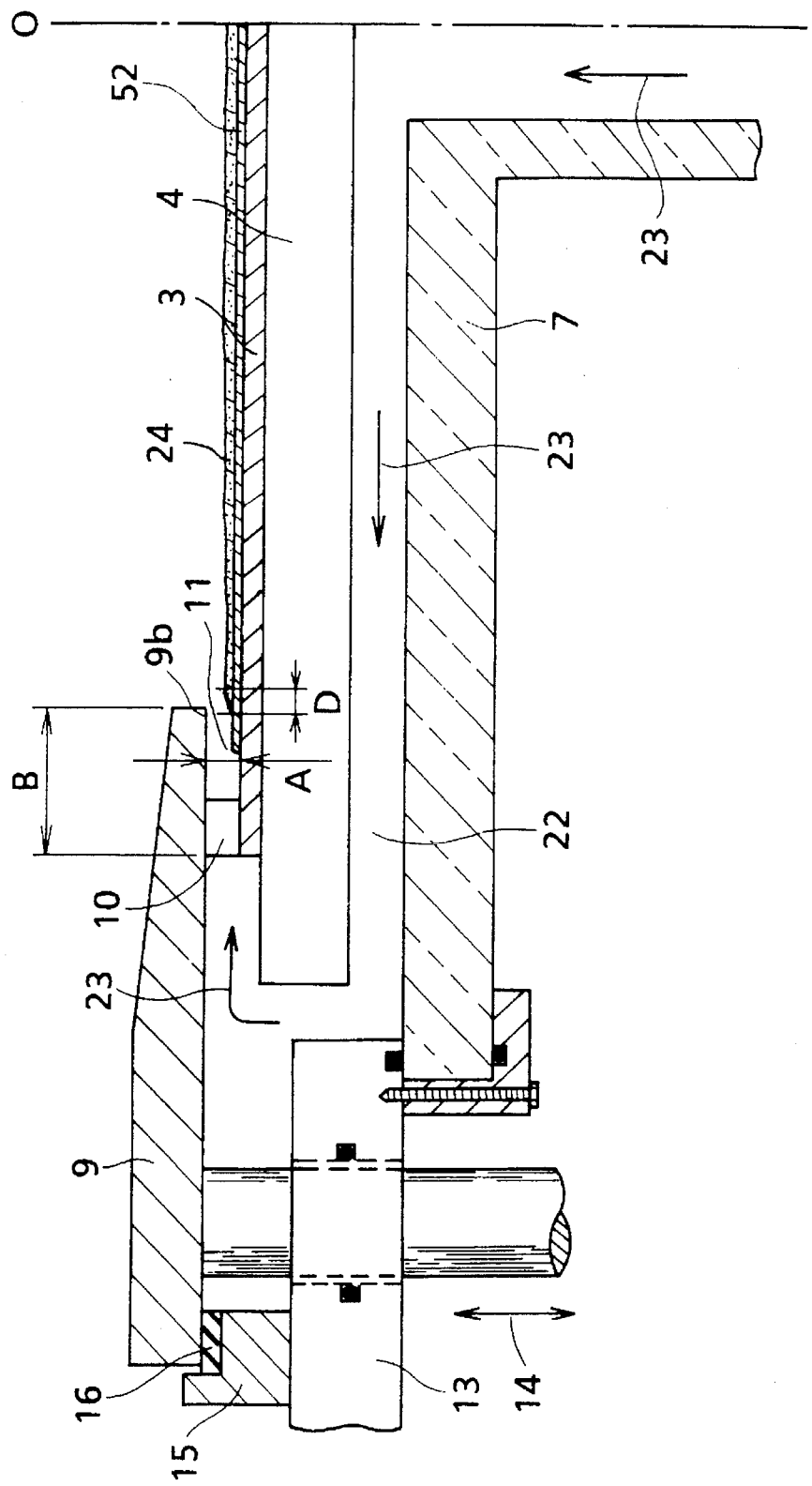
FIG. 2 is an enlarged longitudinal sectional view of FIG. 1 showing the relationship between the ring chuck and a substrate.

The substrate (3) placed on the susceptor (4) is manually affixed by a vertical ring chuck (9), sometimes referred to as a ring-shaped member, so that a first surface of the substrate (3) contacts the ring chuck (9) and a second surface of the substrate (3) is held against the susceptor. The ring chuck (9) is ring-shaped, and has a hole (9a) in the center. FIG. 1 shows a state in which the ring chuck (9) affixes the substrate. FIG. 2 is a partially enlarged view of FIG. 1 showing the contact state between the ring chuck (9) and the substrate (3). On the substrate (3), there are two cumulative layers. As an upper layer, a W film (24) is formed by thermal CVD. As an underlying layer, a TiN film (52) is formed by reactive sputtering. The ring chuck (9) covers the edge portion of the substrate (3). Hereafter, the edge portion of the substrate (3) is defined as the portion of the substrate (3) covered by the ring chuck (9). Moreover, the center of the substrate (3) is located at a central axis 0 of the ring chuck (9).

Figure 3:
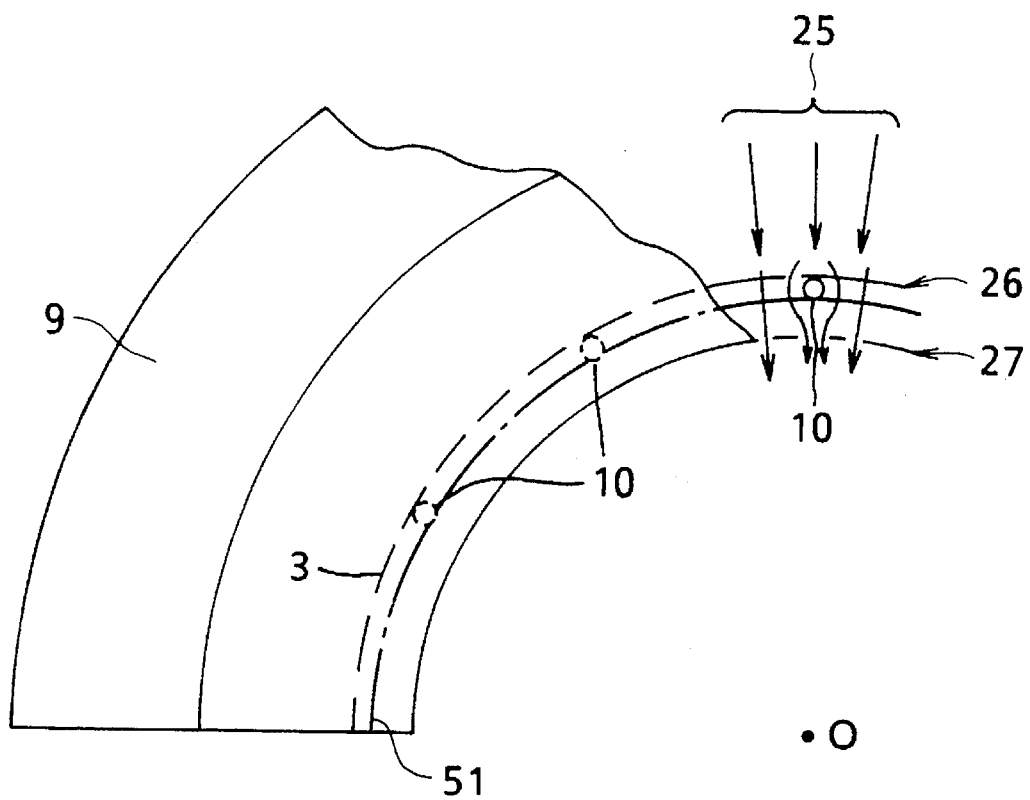
FIG. 3 is partial plan view showing the relationship between the ring chuck and a substrate.

As shown in FIGS. 2 and 3, on the base of the ring chuck (9), at the area in which the ring chuck (9) and the substrate (3) are overlapped, a plurality of point contact members (10) are provided at an equal pitch. These point contact members (10) are in contact with the edge portion of the substrate (3) to fix the substrate (3). The point contact members (10) are intended to make the contact area on the surface of the substrate as small as possible, and scale down the size of the point contact members as much as possible.

As regards the shape of the point contact member (10), such a shape as not to disturb the flow of the purge gas is the best. For this reason, each side of the point contact member is made into a curved surface. Its bottom cross-section shape should be either circular or elliptical. Particularly, if the bottom cross-sectional shape is elliptical, its major axis is designed to run parallel to the streamline direction of the purge gas.

Figure 17:
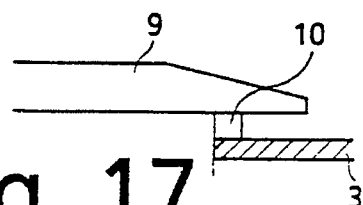
FIG. 17 is a longitudinal sectional view showing the positional relationship in which the outer side of the contact portion of a ring chuck is matched up with the side of the substrate.
Figure 19:
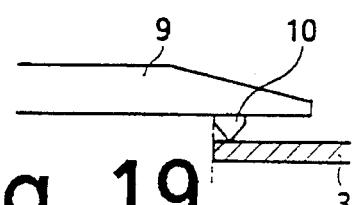
FIG. 19 is a longitudinal sectional view showing that the point-contact member of a ring chuck is pin-shaped, and showing the positional relationship in which the outer side of the contact portion is trued up with the side of the substrate.
Figure 18:
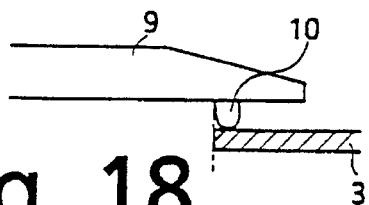
FIG. 18 is a longitudinal sectional view showing that the bottom shape of the point contact member of a ring chuck is a curved surface, and showing the positional relationship in which the outer side of the contact portion is matched up with the side of the substrate.

As regards the position of the point contact member (10), as can be seen from FIGS. 1 through 3, the side of the point contact member facing the central axis 0 of the ring chuck (9) is located on the circumference of a concentric circle having a larger diameter than the diameter of the hole (9a). In other words, it is located farther than the inner edge (9b) of the ring chuck (9) from the central axis 0 along the radial direction. Preferably, the distance from the point contact member (10) to the inner edge (9b) is to such a degree that the entire bottom face of the point contact member 10 comes into contact with the edge portion of the substrate (3) when the ring chuck (9) mechanically presses against the substrate (3) at the point contact members. In particular, to securely press the substrate (3), the outer side of the point contact member (10) is designed to be trued up with the outer edge of the substrate (3), as shown in FIGS. 17, 18 and 19.

As shown in FIG. 3, a concentric circle (51) extends beyond the region of the TiN thin film (52). For this reason, the point contact member (10) is in contact only with the SiO$_2$ exposed surface of the substrate (3). The point contact member (10) can be directly manufactured on the ring chuck (9) by machining, or it may be attached separately.

Regarding the number of the point contact members (10), three to about twelve pieces are the most suitable. To allow the substrate to be in close contact and secure with the susceptor (4), the number of the point contact members (10) is increased as the diameter of the substrate (3) is increased. For an eight inch substrate, twelve point contact members are suitable in number.

Since the substrate is fixed with the ring chuck (9) with point-contact members, the contact area is noticeably reduced as compared with conventional fixing by contact along the overall perimeter. As a result, the amount of heat which is transferred from the substrate to the substrate fixture, which is the cause of the temperature drop at the edge portion of the substrate, can be also reduced. In the vicinity of the edge portion of the substrate in contact with the substrate fixture, the temperature drop becomes smaller than in the conventional case. Thus, the substrate temperature distribution is more uniform, and therefore, the uniformity of the thickness across a thin film over the entire substrate is improved.

Since the substrate (3) and the ring chuck (9) are in contact through the point contact members (10), a gap (11) is formed between the substrate (3) and the ring chuck (9) when the former is fixed by the latter. In FIG. 2, the space of the gap (11) is indicated by symbol A, and the width of the portion of the substrate (3) overlapped with the ring chuck (9) in the radial direction of the central axis 0 is indicated by symbol B. In other words, width B of this overlapped portion is the difference between the radius of the inner circle of the ring chuck (9) and the radius of the substrate.

The above ring chuck (9) is supported by a plurality of props (12) on the base of the ring chuck (9). In the present embodiment, two props (12) are used. The props (12) are drawn outside the reaction vessel toward the lower wall (13) of the reaction vessel (1) to a state where air tightness is maintained. The props (12) are coupled to an elevator (not shown) outside the reaction vessel (1) to be movable vertically (14), thereby moving the ring chuck (9) up and down. When the ring chuck (9) affixes the substrate (3), supporting rings (15) are used for the ring chuck (9) to fix the substrate stably. As shown in FIG. 2, a rubber O-ring (16) is attached to the supporting ring (15), and the outer edge portion of the ring chuck (9) is pressed against the rubber 0-ring (16).

On the upper wall of the reaction vessel (1), a gas supply mechanism to supply reactive gas is provided at a position opposite to the substrate (3). The gas supply mechanism comprises a gas blow-off portion (17), a gas inlet nozzle (18), and a reactive gas source (19). In the CVD process according to the present embodiment, the tungsten film deposition process progresses by reducing the WF$_6$ reaction with H$_2$. Thus, the reactive gases to be supplied from the reactive gas source (19) are WF$_6$ and H$_2$.

A circulating passage (30) is connected to a circulating pump having a temperature adjusting mechanism through piping (31). As the heating medium flowing through the circulating passage (30), inert gas, water or oil are useful. A range of the setting temperature of the heating medium is higher than the temperature at saturated vapor pressure of HF gas, which is one of the by-products produced by the WF$_6$ reaction with H$_2$, and lower than the temperature at which a W film starts to be deposited. The temperature at saturated vapor pressure of HF gas is about 70° C. The temperature at which the W film starts to be deposited is about 200° C. If the heating medium, the temperature of which is set within this range, is circulated in the circulating passage (30), the temperature at the inner wall of the reaction vessel (1) becomes 70° to 200° C. If the temperature of the inner wall of the reaction vessel (1) is higher than that at saturated vapor pressure of HF gas, it is difficult for the HF molecules, one of the by-products, to adhere to the inner wall. Also, if the temperature of the inner wall of the reaction vessel (1) is lower than 200° C., no W film will be deposited on the inner wall. Accordingly, the work load for cleaning the inner wall of the reaction vessel (1) is reduced. When starting the cleaning work, the supply of reactive gases is stopped and the temperature of the wall surface of the reaction vessel falls, to about 40° C. by lowering the setting temperature of the heating medium by the temperature adjusting mechanism.

Moreover, the inner wall of the reaction vessel (1) is heated by the circulation of the heating medium in the circulating passage (30), and therefore, most H$_2$ molecules, as a reactive gas, collide with the heated inner wall to receive the heat. Thus, the heated H$_2$ molecules, when they collide with the substrate (3) and ring chuck (9), do not take the heat away from the substrate (3). For this reason, to maintain the substrate (3) at a predetermined temperature, the amount of the radiation heat irradiated to the susceptor (4) requires less than when the heating medium is not circulated in the circulating passage (30). Moreover, the temperature at the ring chuck (9) does not fall greatly. It is possible to suppress the promotion of heat transfer due to the great temperature difference between the substrate (3) and the ring chuck (9). The circulating passage may be provided on the upper wall of the reaction vessel (1). If so, the H$_2$ gas is heated up more completely.

Behind the susceptor (4), there is provided a purge gas supply mechanism comprised of a supply nozzle (20) for purge gas and a purge gas source (21). As a useful purge gas, an inert gas such as argon Ar, is used. Purge gas supplied into the CVD processing system from a nozzle (20) passes through a passage (22), and a gap (11) between the ring chuck (9) and the substrate (3) to be blown off into a reaction chemical atmosphere. When the purge gas passes through between the susceptor (4) and the silica window (7) midway in the passage (22), the purge gas is heated by the lamp heaters (5).

Since the purge gas is heated, the purge gas does not take the heat away from the point contact member (10) and the substrate edge portion when passing through the gap (11) between the ring chuck (9) and the substrate (3). Therefore, it is possible to prevent the temperature in the vicinity of the edge of the substrate (3) from falling drastically. In FIG. 2, the arrow (23) indicates the direction of the flow of the purge gas. The space between the supporting ring (15) and the outer edge portion of the ring chuck (9) is sealed by the foregoing fluorocarbon rubber (16) so that all the purge gas supplied is blown off through the gap (11), and the rubber (16) prevents the purge gas from leaking.

In the above embodiment, the typical film deposition conditions are such that the deposition temperature is 400° C., deposition pressure 50 Torr, and the supply flow rates of depositing reactive gases $H_2$ and $WF_6$ are 1,000 sccm and 100 sccm, respectively.

A description will be made of the deposition operation using the above CVD processing apparatus. An atmosphere within reaction vessel (1) of the CVD processing apparatus is at the required reduced pressure state. On the susceptor (4), set to a predetermined temperature by being heated by plurality of lamp heaters (5), a substrate (3), transferred by a transferring mechanism (not shown), is placed. On the surface of the substrate (3), a TiN film or a TiW film has already been deposited in a pretreatment process, such as a sputtering process, and also a ring-shaped $SiO_2$ surface is exposed in the vicinity of the edge portion of the substrate (3). After the substrate (3) is placed on the susceptor (4), the ring chuck (9) is lowered to fix the substrate (3). The point contact members (10) of the ring chuck (9) are allowed to come into contact with the periphery of the edge of the substrate (3) to fix the substrate (3). When the substrate (3) is fixed, reactive gas is blown off from the gas blow-off portion (17), and carried into the reaction chamber. A thin film is deposited from the reactive gas by chemical reaction on the surface of the substrate (3).

In the tungsten film deposition, reactive gases $WF_6$ and $H_2$ are conducted into the reaction vessel (1) to deposit a W thin film on the substrate (3) by reducing the reaction of $WF_6$ with $H_2$. The unreacted gas and by-product gas are exhausted outside through an exhaust tube (2). While the above deposition is being performed, purge gas is supplied through a nozzle (20) from below at a flow rate required in accordance with the deposition condition. The purge gas supplied into the CVD processing apparatus is blown off into the chemical reaction atmosphere through the gap (11).

The CVD processing apparatus having the above structure has the following two actions.

The first action is to improve the thickness uniformity on the substrate. The ring chuck (9) for fixing the substrate (3) is in contact with the substrate (3) only at the point contact members (10). Therefore, the heat amount escaping from the substrate (3) to the ring chuck (9) is reduced in proportion to the reduced contact area, compared with the conventional ring chuck the contact member of which is in contact with the substrate along its entire circumference. For this reason, the substrate temperature is not lowered sharply at the edge portion of the substrate, nor does the sheet resistivity rise sharply at the edge portion of the substrate unlike in the conventional case, thus making it possible to attain good thickness uniformity over the entire substrate surface.

To make the temperature distribution over the entire substrate surface uniform, material having a high thermal conductivity is used for the susceptor. The surface of the susceptor in contact with the substrate determines the temperature distribution on the substrate. By using a material having a high thermal conductivity, it is possible to set the temperature over the entire surface of the susceptor to a predetermined temperature immediately. In other words, it can be said that the temperature of a substrate placed on the susceptor also becomes a predetermined temperature immediately. The temperatures of the susceptor and substrate can be also adjusted quickly in response to fine adjustment of an amount of heat (radiant heat) irradiated from a heating mechanism such as lamp heaters. As materials having a high thermal conductivity, aluminum, carbon and copper are the most suitable. The susceptor used in the present embodiment is made of aluminum.

Furthermore, to attain uniform temperature over the entire substrate surface, a plurality of lamp heaters are provided in back of the substrate, and each of these lamp heaters has a power controller to control the amount of light irradiation. By adjusting the arrangement and power controllers of the individual lamp heaters, it is possible to make the temperature distribution over the entire substrate surface uniform.

It is considered that the heat of a substrate escapes at the contact portion where the substrate is pressed by the ring chuck at the contact point members, and accordingly, that the temperature in the vicinity of the contact portion will be lower than the average temperature on the substrate surface. Regarding the arrangement of the individual lamp heaters, it is best to arrange them behind in the vicinity of the contact portion where the ring chuck presses the substrate. The power controller for each of the lamp heaters is used to adjust the amount of light irradiation from the respective lamp heaters delicately. In particular, if the lamp heaters are arranged on a concentric circle having the same center as that of the substrate at an equal pitch in back of the contact portion, light can be uniformly irradiated on the contact portion. According to such a lamp heater arrangement, there occurs no problem for nonuniform light irradiation due to discontinuous irradiation distribution when one circular lamp heater or two semi-circular lamp heaters are used as in the conventional case.

Also, even if nonuniform temperature distribution occurs due to nonuniform pressure with which the substrate is pressed by the ring chuck, or as a result of the delicate differences in the amount of light irradiation from the respective lamp heaters applied in the same electric power, it is possible to correct the temperature on the surface of the substrate by controlling the electric power applied to each of the lamp heaters respectively by their own power controller. As the most suitable arrangement of lamp heaters for this correction, a plurality of lamp heaters are arranged on a concentric circle having the same center as that of the substrate at an equal pitch right in back of the contact portion.

If the heating mechanism is installed outside of the reaction vessel, it is possible to prevent any deterioration due to chemical corrosion or film deposition of reactive gases on the surface of the heating mechanism. As the optimum heating mechanism to be used outside the reaction vessel, a lamp heater is the most suitable.

Then, film deposition process is performed under the condition that the same electric power is applied to each of the lamp heaters. The temperature distribution over the surface of the substrate is determined from the film thickness distribution. The electric power applied to each of the lamp heaters increases or decreases in accordance with the temperature distribution (the film thickness distribution). Thereafter, a film deposition process is performed again, and if the film thickness distribution becomes uniform, the operation is terminated. If not, the foregoing correction operation is repeated again. Since there are twelve contact portions in the present embodiment, it is best to arrange the twelve lamp heaters in a concentric circle at an equal pitch.

Light irradiated from the lamp heaters heats the substrate holding base through a window made of light-transmissive material incorporated in the reaction vessel. Since the electric power can be individually controlled for each of the lamp heaters, there is no possibility that nonuniform light irradiation distribution occurs due to discontinuous irradiation from the lamp heater which is not avoidable when conventional semi-circular heaters are used.

Furthermore, it is possible to correct any uneven temperature distribution on the substrate resulting from uneven temperature distribution on the substrate holding base, or contact portions with a substrate fixture. Thus, it is possible to make the temperature distribution of the substrate uniform by adjusting the arrangement of the lamp heaters and their power, resulting in good thickness uniformity. Moreover, there is an advantage in that the temperature correction for the substrate can be performed without exposing the interiors within the reaction vessel to the atmosphere.

Moreover, to precisely attain uniform temperature over the entire substrate surface, a stepped area is machined on the susceptor surface that is in contact with the substrate. By controlling the step-machined region and its depth, it is possible to make the temperature distribution on the substrate surface more uniform. The range (the radius if circular, the inside and outside diameters if doughnut-shaped) and the depth of the stepped area to be provided are determined according to the difference between the average temperature of the substrate and the temperature of the substrate holding base. In particular, the surface of the substrate holding base corresponding to a region at a higher temperature than the average temperature of the substrate is provided with a stepped area. The substrate is heated by the transfer of heat from the substrate holding base to the substrate through contact between them and through the gas existing in the gap between them. Since the contact between the substrate and substrate holding base is eliminated in the region where the surface of the substrate holding base is machine stepped, the heat transfer phenomenon through contact between them disappears.

Since the amount of heat transfer in the noncontact area is less than in the contact area, the temperature of the substrate corresponding to the region where the stepped region is provided drops. As a result, the heat transfer between the substrate and substrate holding base within the region where the surface of the substrate holding base is stepped is effected only due to the medium of gas existing in the gap. Since the pressure of the atmosphere during deposition is several tens Torr, the pressure within the gap where the surface of the substrate holding base is stepped is several tens Torr, or higher. Therefore the atmosphere within the gap may be considered to be in a viscous flow state. Due to the viscous flow state in the gap, the rate of heat transfer between the substrate and the substrate holding base depends on the distance between them, and the kind of gas existing in the gap. If the gas existing in the gap is known, the degree of temperature drop of the substrate can be adjusted by adjusting the depth of the stepped area.

Figure 8:
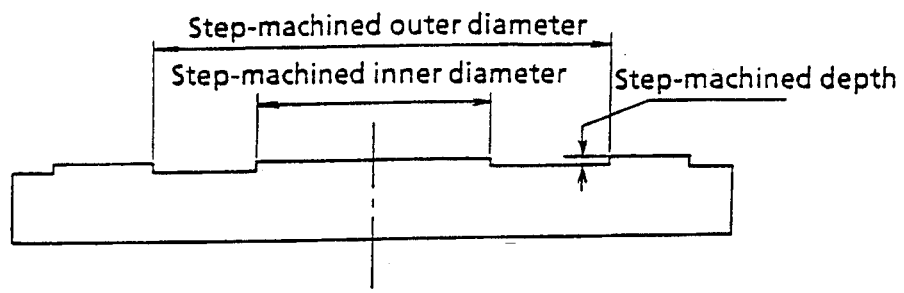
FIG. 8 is a view showing sheet resistivity distribution along the radial direction of the substrate in thickness distribution according to the preferred embodiment, and a stepped area provided on the surface of a susceptor used in the present embodiment, corresponding to the sheet resistivity distribution.
Figure 8:
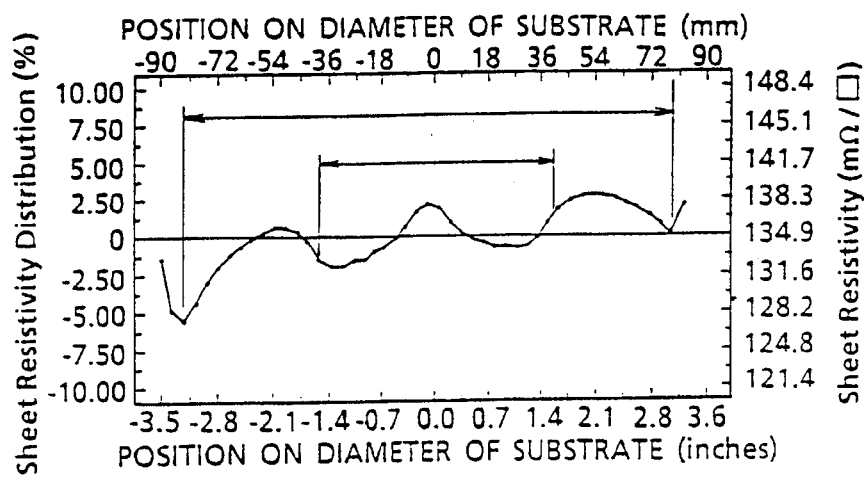
Figure 13:
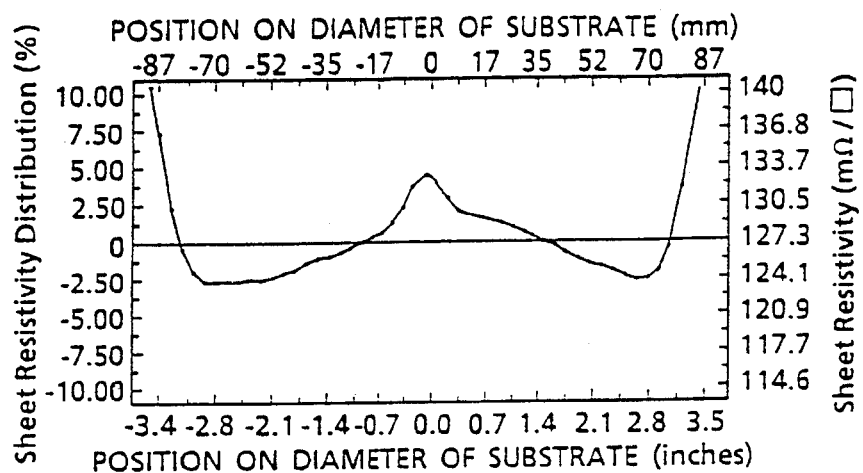
FIG. 13 is a view showing sheet resistivity distribution along the radial direction of the substrate in thickness distribution according to a conventional CVD processing apparatus.
Figure 9:
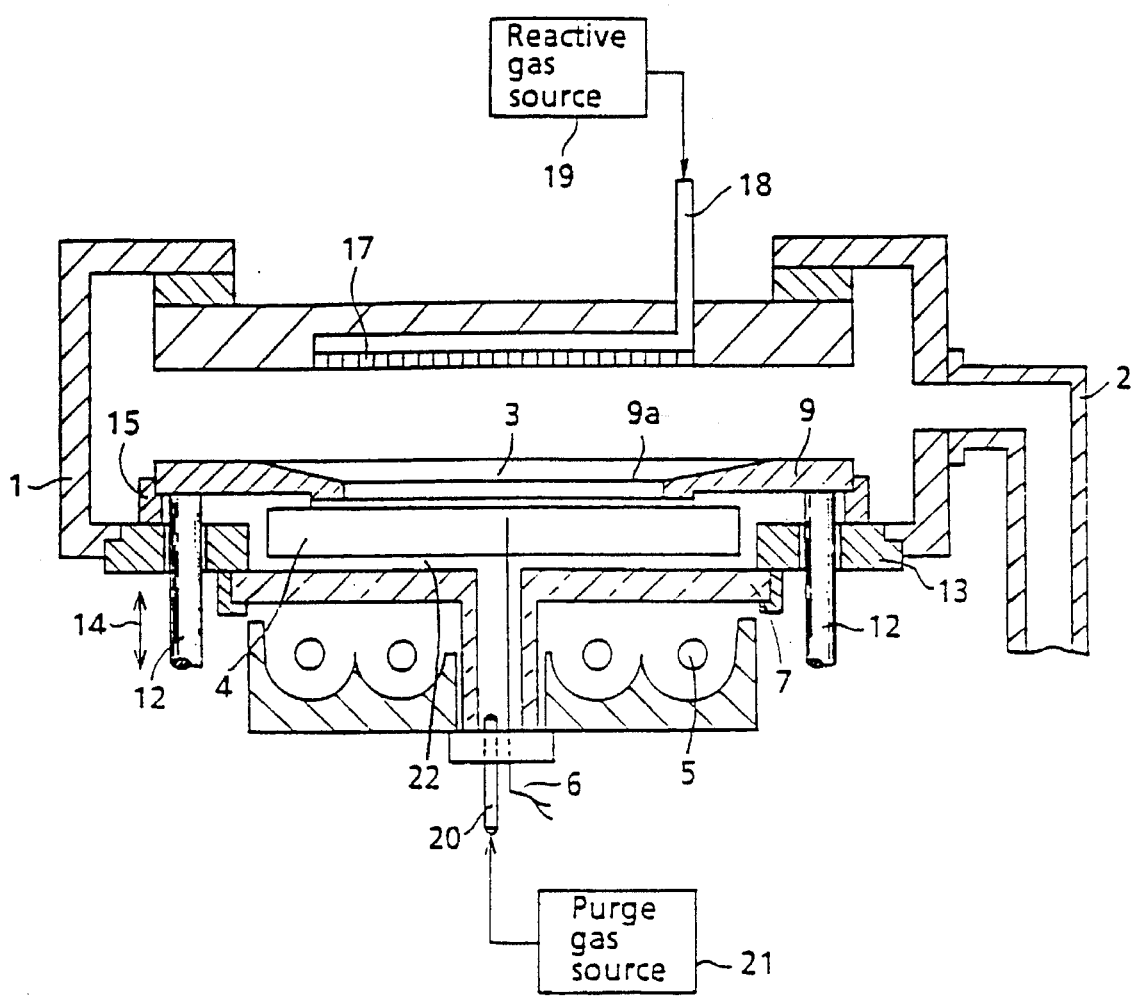
FIG. 9 is a longitudinal sectional view for a conventional CVD processing apparatus.
Figure 10:
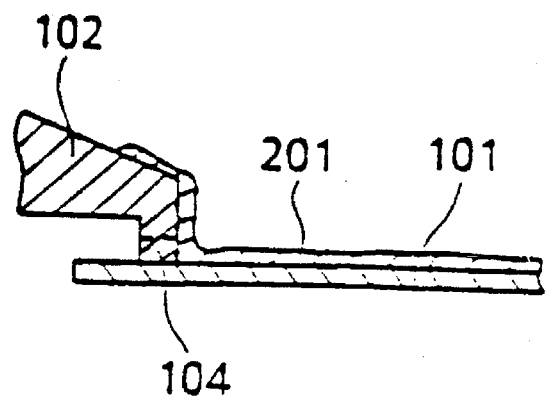
FIG. 10 is a view explaining micro-peeling occurring in a conventional CVD processing apparatus.
Figure 11:
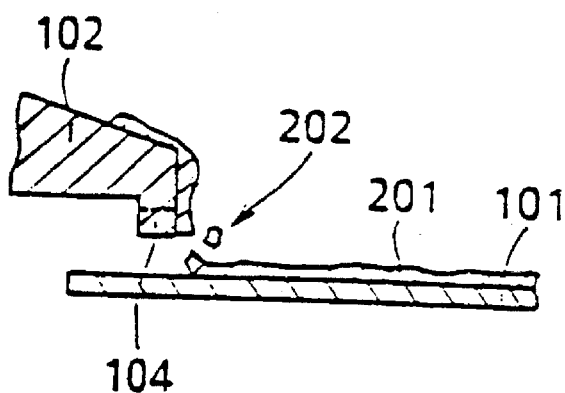
FIG. 11 is a view explaining micro-peeling occurring in a conventional CVD processing apparatus.
Figure 14:
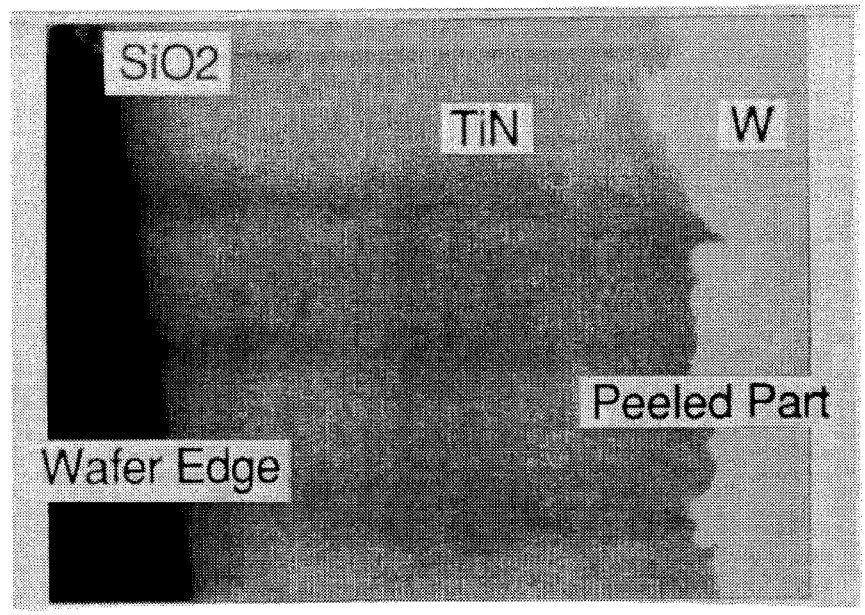
FIG. 14 is an optical microscope photo showing micro-peeling occurring on the edge portion of a substrate on which a blanket W film is deposited by a conventional CVD processing apparatus.

According to advanced machining technology, the depth of the stepped area for the substrate holding base can be precisely machined in units of 0.01 mm. The high temperature region is determined from the thickness distribution, and the surface of the substrate holding base corresponding to the high temperature region is machine stepped. Thus, it is possible to lower the temperature of the substrate in the vicinity of the area corresponding to the stepped region. If such a substrate holding base, with a stepped region provided is used, the temperature of the entire substrate drops compared with a substrate holding base without any stepped area provided thereon, as can be seen in FIGS. 8 and 13. However, it is important to make the temperature distribution over the entire substrate uniform. For this, reason, it is not particularly a problem to lower the temperature over the entire substrate. This is because the substrate temperature can be raised by adjusting the irradiating intensity from the heating mechanism to increase the amount of heat supplied to the substrate holding base.

To determine the shape of the stepped area, film deposition is first performed under the condition that there is no stepped area, and the area with low sheet resistivity, that is the area where the temperature is higher than the average temperature, is step-machined appropriately. Thereafter, the film deposition process is performed, and if the thickness distribution becomes uniform, the operation is terminated. If not, correction by step-machining is performed again.

The step-machined region can be determined in the following way. First, a film is deposited on the entire substrate using a susceptor with no stepped area. The sheet resistivity of the film deposited on the entire substrate surface is measured. The average sheet resistivity is derived from the maximum and minimum sheet resistivities. The sheet resistivity is in inverse proportion to the temperature on the substrate surface. The maximum sheet resistivity indicates the lowest temperature on the substrate surface, and the minimum sheet resistivity indicates the highest temperature on the substrate surface. The average sheet resistivity indicates the average temperature on the substrate surface. Thus, a region indicating a lower sheet resistivity than the average sheet resistivity, that is, a higher temperature than the average substrate temperature may be step-machined.

The depth of the step-machined region can be determined on the basis of the following consideration. The step-machined portion in the susceptor forms a gap between the substrate and susceptor. Purge gas usually enters this gap. Since the width of the gap is considered to be greater than the mean free path for the entering gas, the state of the flow of gas can be said to be a state of viscous flow. Heat transfers to the substrate through this gap. The state of flow of purge gas which exists in the gap, is a viscous flow, and therefore, the amount of heat which transfers to the substrate depends on the kind of the gas and the width of the gap, that is, the depth of the stepped area. When a specific purge gas, for example, Ar gas, is used, the amount of heat transferring to the substrate depends on only the width of the gap, that is, the depth of the stepped area. The deeper the stepped area is, the more the amount of heat, which transfers to the substrate, decreases. In other words, the deeper the stepped area is, the more the rise in the temperature on the substrate surface is suppressed.

On the basis of the above viewpoint, the depth of the stepped area is adjusted in proportion to the temperature difference (difference in sheet resistivity) between the average temperature (average sheet resistivity) and a higher temperature than it (lower sheet resistivity). For example, if the susceptor is made of aluminum and Ar gas is used as the purge gas, it is found from the graphs shown in FIGS. 13 and 8 that, as the stepped area becomes deeper by 0.1 mm, the temperature on the substrate surface is lowered by about 6° C. Such a relationship between the depth of the stepped area and the temperature difference on the substrate surface can be easily found. On the basis of this relationship, it is possible to make the temperature distribution on the entire substrate surface uniform by adjusting the step-machining depth. If it is necessary to readjust, a film is deposited on a substrate using the first step-machined susceptor, the first step-machined region and its depth are adjusted again on the basis of the sheet resistivity distribution. If such a susceptor step-machined by adjusting the region and its, depth repeatedly is used, it is possible to make the temperature distribution over the entire substrate surface precisely uniform. As a result, the temperature of any portion in the entire substrate surface becomes the desired one.

Figure 6:
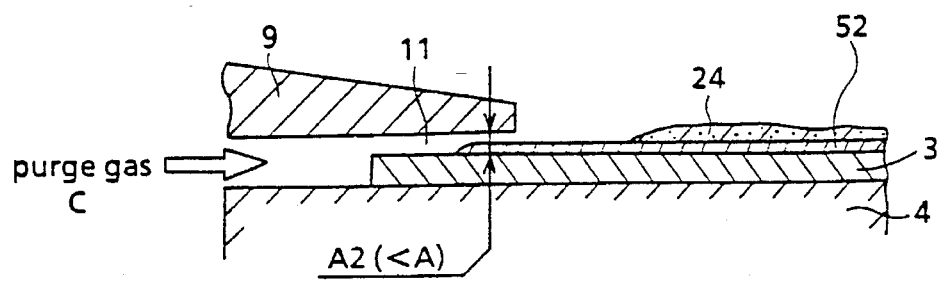
FIG. 6 is a longitudinal sectional view showing a third condition for explaining the positional relationship between the ring chuck and a substrate.
Figure 16:
FIG. 16 is a contour map for the sheet resistivity distribution in thickness distribution across a W film when 12 lamp heaters are arranged in a circle and no stepped portion is provided for the susceptor.

Preferably, twelve lamp heaters are arranged on a concentric circle having the same center as that of the substrate at equal pitch in back of the periphery of the contact portion where the ring chuck (9) presses the substrate (3). FIG. 16 is a contour map for the sheet resistivity distribution when a susceptor (4), made of aluminum, is not step-machined in such a lamp heater arrangement. Moreover, the respective power controllers are adjusted so that a portion at a high temperature in the peripheral portion of the substrate becomes an annular concentric circle. The portion where even sheet resistivity lines are dense in FIG. 6 is a portion at a high temperature on the substrate surface. A portion of the susceptor (4) corresponding to the portion at a high temperature on the concentric circle is step-machined. The results are shown in FIGS. 7 and 8.

Figure 7:
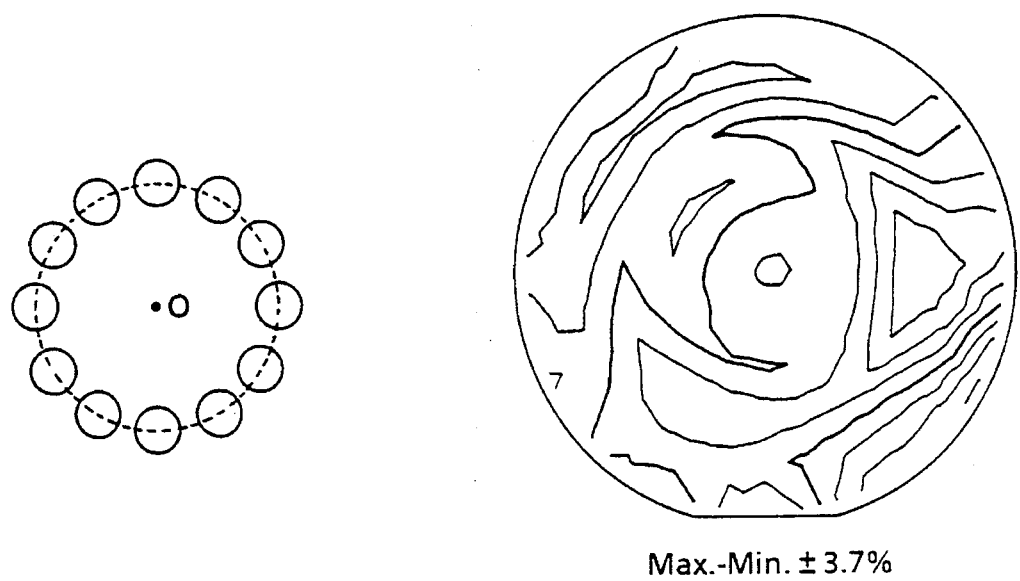
FIG. 7 is a contour map for the sheet resistivity distribution showing thickness uniformity across a W film when twelve lamp heaters are arranged in a circle and the susceptor is provided with a stepped area according to this preferred embodiment.
Figure 12:
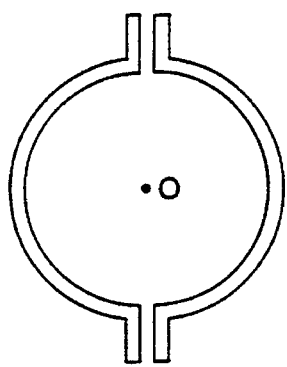
FIG. 12 is a contour map for the sheet resistivity distribution thickness uniformity across a W film according to a conventional CVD processing apparatus, and a view showing an arrangement of two semicircular lamp heaters used in the conventional CVD processing apparatus corresponding to thickness distribution.
Figure 12:
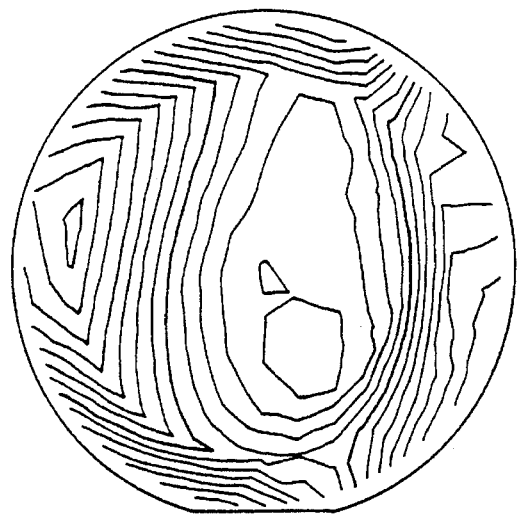

FIGS. 7 and 8 are views showing the sheet resistivity distribution of a W film deposited on an eight inch substrate by using an apparatus according to the present embodiment. FIG. 7 shows an in-plane distribution within a diameter of 180 mm, and the distribution is within ±3.7%. In FIG. 7, no nonuniformity caused by a conventional lamp heater as shown in FIG. 12 can be seen. FIG. 8 shows the sheet resistivity distribution along a radial direction. In FIG. 8, there is no sharp rise in the sheet resistivity at the edge portion of the substrate compared with a conventional apparatus, but the portion which was low in the sheet resistivity according to conventional results has become highly convex from the effects of the step-machined susceptor, with the sheet resistivity distribution being within ±3.3%.

In the present embodiment, the shape of the step-machined area for an eight inch substrate is an annular one with an outer diameter of 170 mm, and an inner diameter of 80 mm, and a depth of 0.1 mm. Also, the shape of the step-machined area for a six inch substrate, is an annular one with an outer diameter of 120 mm, an inner diameter of 60 mm, and a depth of 0.1 mm. Moreover, if an orifla is formed in the substrate, the orifla is taken into consideration, and the edge line of an area to be step-machined is preferably arranged to be in parallel with the line of the orifla so that the distance between the edge of the substrate and the edge of an area to be step-machined becomes constant.

The second action is the formation of a distinct shadow region and prevention of micro-peeling. As can be seen from FIG. 2, the side of the point contact member (10) facing the central axis 0, that is the inner side is not flush with the inner edge (9b). Therefore, when a thin film (24) is deposited on the surface of the substrate (3), the thin film (24) is not formed continuously extending to the upper surface of the ring chuck (9) via the inner side of the point contact member (10). Thus, when the ring chuck (9) is separated from the substrate (3), micro-peeling, which occurs in a conventional apparatus, does not occur, thus generating no fine dust particles.

With such a ring chuck (9), through the gap (11) between the substrate (3) and the ring chuck (9), a purge gas is blown off at a required flow rate into the reaction chamber. The purge gas prevents reactive gas from entering the gap (11), and therefore, a thin film (24) to be deposited on the surface of the substrate (3) is not deposited on the substrate surface within the gap (11). As shown in FIG. 2, the thin film (24) is formed so that the outer edge of the thin film (24) coincides to a substantial extent with the inner edge (9b) of the ring chuck (9).

By adjusting the flow rate of the purge gas to be blown through the gap (11), the edge of the thin film (24) to be deposited can coincide to a substantial extent with the inner circle of the ring chuck (9). For this reason, as mentioned later, the flow rate (represented by the symbol C) of the purge gas is set to satisfy a specific relationship between the distance A of the gap (11) as mentioned earlier, and the width B of the overlapped portion where the ring chuck (9) covers the edge portion of the substrate (3).

If the flow rate of the purge gas and the positional relationship of the point contact members (10) are adjusted, there is no possibility that the thin film (24) deposited on the surface of the substrate (3) will extend into the gap (11) to deposit a thin film continuously extending to the side of the point contact members (10). Accordingly, since the thin film (24) does not reach the point contact member (10), when the ring chuck (9) is separated from the substrate (3), micro-peeling fails to occur, thus generating no dust particles.

Blowing purge gas through the gap (11) at a required flow rate enables a sharp shadow boundary to be formed. From a different angle, the formation of such a sharp shadow boundary means not to deposit any thin film on the side of the point contact member (10) in contact with the edge portion of the substrate.

Figure 4:
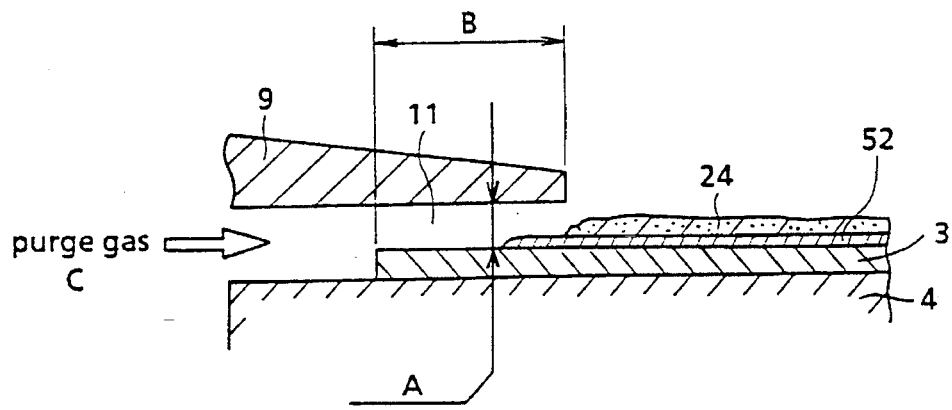
FIG. 4 is a longitudinal sectional view showing a first condition for explaining the positional relationship between the ring chuck and a substrate.
Figure 5:
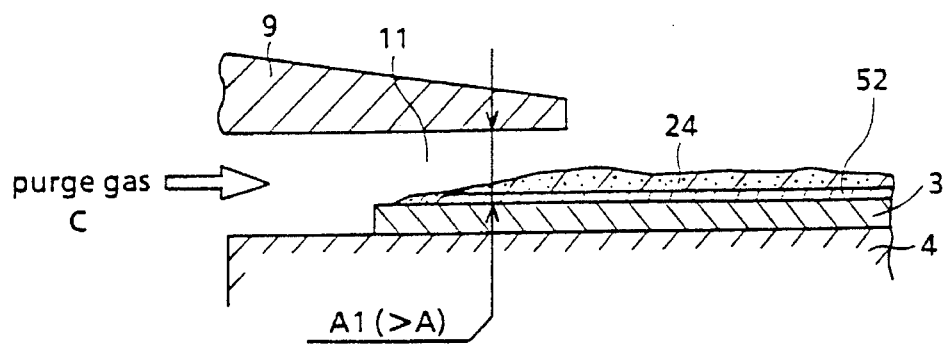
FIG. 5 is a longitudinal sectional view showing a second condition for explaining the positional relationship between the ring chuck and a substrate.

With reference to FIGS. 4 through 6, a description will be made of the formation of the shadow boundary in the present embodiment.

FIGS. 4 through 6 show the relationship between the inside diameter circle of the ring chuck (9) and the edge of the substrate (3). A (height of gap (11)), B (width of overlapped portion) and C (flow rate of purge gas), as mentioned earlier, are shown in each of these figures. Purge gas is blown off into the reaction chamber through the gap (11) to drive back the reactive gas (mainly $WF_6$) within the gap (11), and thereby, to rapidly reduce the deposition rate in the vicinity of the inner circle of the ring chuck (9), resulting in the formation of a shadowy region. The parameters to determine the shadow width in the formation of the shadow are the linear velocity C/A for the purge gas to blow off through the gap (11) and a diffusion velocity for the reactive gas to enter the gap (11). FIGS. 4 through 6 show the relationship between the linear velocity C/A of the purge gas and the state of the shadow formation.

FIGS. 4 through 6 show the film deposition region on the substrate (3) in the vicinity of the inner circle of the ring chuck (9) when height A between the ring chuck (9) and the substrate (3) is varied at a constant flow rate of the purge gas. As shown in FIG. 4, if the height between the ring chuck (9)

and the substrate (3) is optimum (A is assumed to be the optimum value here), the width of the portion of the substrate where the film is not deposited, that is, the width of the shadow becomes equal to the width B where the ring chuck (9) covers the edge portion of the substrate (3).

On the other hand, as shown in FIG. 5, if the height between the ring chuck (9) and the substrate (3) has a greater value A1 than optimum distance A, the linear velocity C/A1 of the purge gas becomes lower, and the film deposition region on the substrate (3) extends into the gap (11) to deposit a film on the $SiO_2$ region on the edge portion of the substrate. This is not preferable.

On the other hand, if the height between the ring chuck (9) and the substrate (3) has a smaller value A2 than the optimum distance A as shown in FIG. 6, the linear velocity C/A2 of the purge gas becomes higher, and the film deposition region on the substrate (3) does not reach the vicinity of the inner circle of the ring chuck (9), and therefore the film deposition region becomes small. This also is not desirable.

In the cases shown in FIGS. 5 and 6, if C/A1 or C/A2 coincides with the optimum value C/A, it is possible to create the same state as the one shown in FIG. 4 with respect to the film deposition region on the substrate. In other words, if A is higher, the flow rate C of the purge gas must be increased, and when A is small, the flow rate C of the purge gas must be decreased, to set the linear velocity to an optimum value at which an optimum film deposition region shown in FIG. 4 is formed.

If, however, the flow rate of the purge gas is increased, the pressure within the reaction vessel (1) is increased to affect the film deposition process. For example, if the total pressure is constant, the $H_2$ partial pressure is decreased very much, thus the deposition rate is decreased. In such a case, the height A should be designed how and flow rate C of the purge gas should be controlled so as to be small as long as the mechanical accuracy of the apparatus is allowable.

The point contact members (10) can be located outside the inner edge (9b) of the ring chuck (9) along the radial direction from the central axis 0 as shown in FIG. 17, and the outer sides of the point contact members (10) are trued up with the outer edge of the substrate (3). Thus, the substrate (3) can be most securely brought into contact with the susceptor (4). Furthermore, if the width B of overlapped portion is constant, it is possible to maximize the area where a thin film is deposited on the surface of the substrate. The existence itself of the point contact member (10) in the gap (11) becomes an obstacle to the flow of the purge gas, and therefore, the previously mentioned theory for limiting the deposition region cannot be applied simply to a practical case. To prevent the deposition region from reaching the point contact members (10), the point contact members (10) are designed as small as possible and the sides of the point contact member (10) are designed to form a curved surface. In the present embodiment, the shape of the point contact member (10) is a column or a cylinder. This causes the purge gas (25) to sufficiently reach the inner side of the point contact member (10) as shown in FIG. 3. At the point contact member, the shadow width is the same as that at places other than the point contact member. Regarding the size of the point contact member (10), it is determined on the basis of the relationship between the point contact member and width B where the ring chuck (9) covers the substrate (3). In FIG. 3, a line 26 indicates the circumference of the substrate (3), a line (27) indicates the inner circle of the ring chuck (9).

It is possible to prevent any occurrence of dust particles due to peeling off of films deposited on the exposed $SiO_2$ surface. Also, the radius of the inner circle of the ring-shaped member (9) is designed to be shorter than the shortest distance between the central axis 0 of the ring-shaped member and the deposition region of TiN (or TiW) film deposited beforehand. Thus, it is possible to further prevent W film from being deposited on the exposed surface of $SiO_2$. Moreover, the W film can be assuredly deposited on the TiN (or TiW) film, which serves as a ground layer.

The radius of a concentric circle where the sides of the contact portion facing the central axis of the ring-shaped member are located is designed longer than the longest distance between the central axis 0 of the ring-shaped member and deposition region of the TiN (or TiW) film deposited beforehand. Thus, the point contact members come into contact on only the exposed $SiO_2$ surface of the substrate. If point-contact members mechanically press on the TiN (or TiW) film, there may be a possibility that the TiN (or TiW) film is peeled off the substrate. However, such an arrangement of the point-contact members does not cause the TiN (or TiW) film to peeled off.

Figure 15:
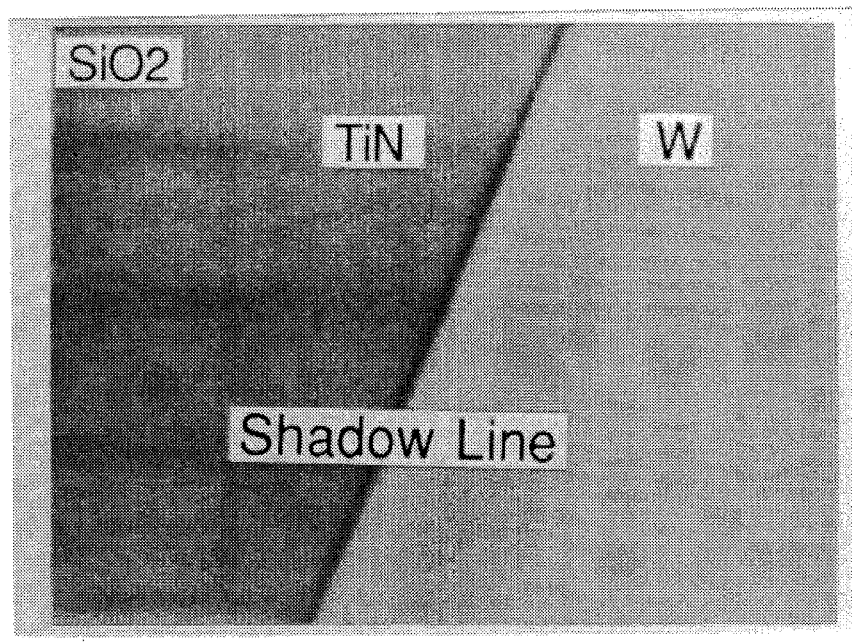
FIG. 15 is an optical microscope photo showing a shadow line which is formed on the edge portion of a substrate on which a blanket W film is deposited by a CVD processing apparatus according to this preferred embodiment.
Figure 20:
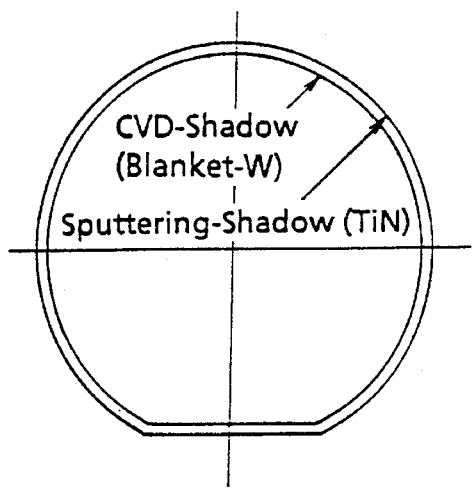
FIG. 20 is a view showing that definite shadow lines are drawn on the entire substrate.

Next, a concrete embodiment will be described. As mentioned earlier, a shadow is determined by height A of the gap (11), width B where the ring chuck (9) covers the substrate (3) the difference between the radius of the inner circle of the ring chuck (9) and the radius of the substrate (3), and flow rate C of the purge gas (Ar gas). The optimum values for these parameters are 0.2 to 0.3 mm for A, 3 mm for B and 300 sccm for C. If these optimum values are used, below the vicinity of the inner circle of the ring chuck (9), the film thickness drastically becomes thin, as can be seen in FIG. 4. No film was deposited in the edge portion of the substrate (3), and therefore, a sharp shadow line is formed. At this juncture, the width of the shadow is almost equal to B, being 3 mm. FIG. 15 is an optical microscope photo showing a shadow line formed at the edge of a blanket W film deposited on a substrate by an apparatus according to the present embodiment. The width of the shadow line is about 0.3 mm, and no micro-peeling was observed. FIG. 20 shows a sharp shadow line formed over the entire substrate. According to the results from the observation of film formation state by an electron microscope, it is within width D of about 300 μm as shown in FIG. 2 that the film thickness quickly becomes very thin. Other than the area of width D, the film thickness was uniform. In this case, a ring chuck (9) having a twelve point contact is used. The inner side of each of the point contact members is located on the circumference of a larger circle (51) than the inner circle of the ring chuck (9) at an equal pitch.

As regards the contact area of the point contact member (10) in contact with the substrate (3), as small a contact area as possible is preferable. Since the amount of heat transfer is in proportion to the contact area, the amount of heat which escapes from the substrate (3) to the ring chuck (9) is determined by the area of the point contact member (10) in contact with the substrate (3), that is, the area of the bottom of the point contact member (10). The shape of the bottom of the point contact member (10) should be a curved surface as shown in FIG. 18, or pin-shaped, as shown in FIG. 19.

As regards the size of the point contact members, the longest distance in the cross-section of the point contact member (10) is preferably shorter than distance B. In other words, if the cross-section shape of the point contact member (10) is circular or elliptical, the diameter or major axis is preferably shorter than distance B, respectively. In particular, it is desirable to set it to less than the half distance B. If B is 3 mm, the diameter or major axis of the point contact portion is preferably 1.0 to 1.5 mm. In the present embodiment, the width of the shadow is 3 mm at the point contact member (10).

Figure 21:
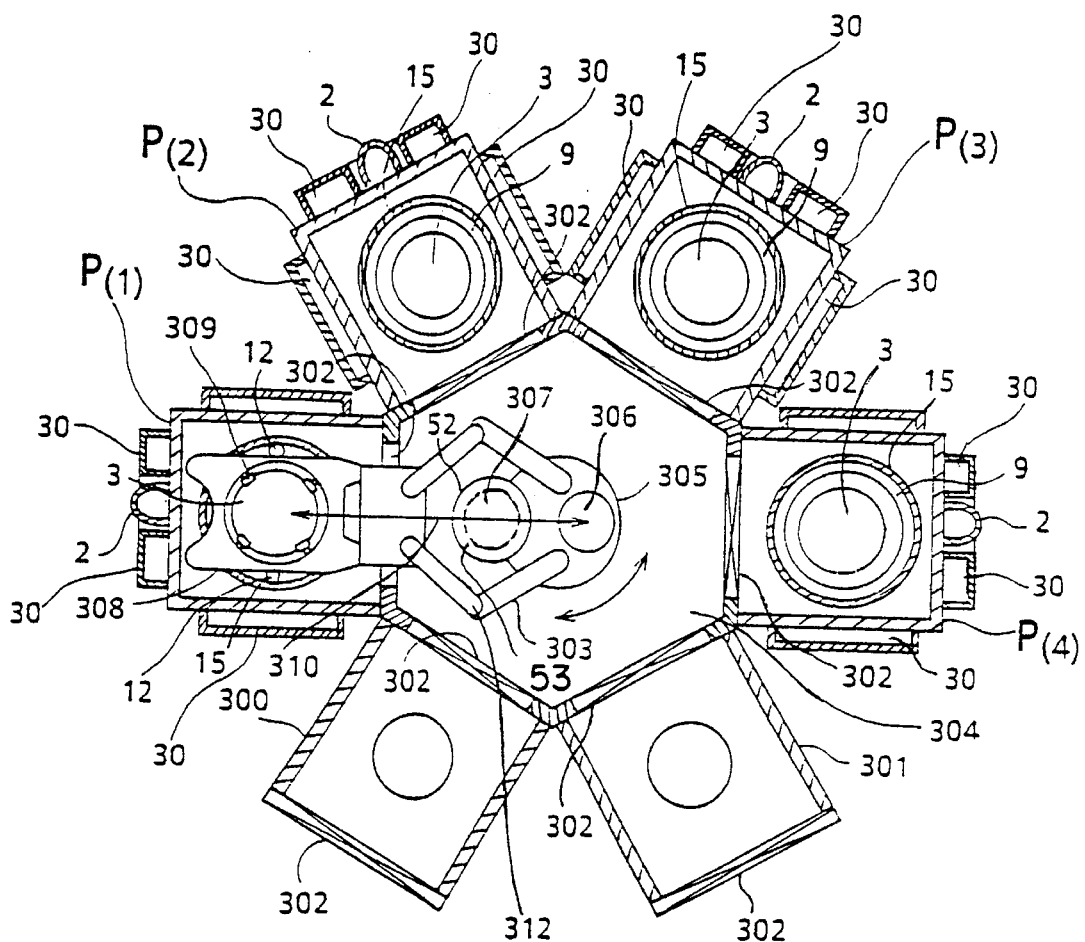
FIG. 21 shows a preferred embodiment of a multi-chamber system in which each of modularized processing vacuum vessels is a CVD processing reaction vessel.

FIG. 21 shows a preferable integrated multi-chamber CVD processing system. This integrated multi-chamber CVD processing system comprises four CVD processing vacuum vessels having the structure shown in FIG. 1, P(1), P(2), P(3) and P(4), a carrying-in load-lock vacuum vessel (300), a carrying-out load-lock vacuum vessel (301), and a substrate-transferring vacuum vessel (304) provided at the center of these vessels. Each of the vacuum vessels are provided with a vacuum pump (not shown).

In particular, an oil-sealed rotary pump is connected to an exhaust tube (2) for each of the CVD processing vacuum vessels. On the outside wall of each of the CVD processing vacuum vessels, circulating passages 30 are provided in which a heating medium flows to adjust the temperature at the wall surface of each of the CVD processing vacuum vessels. The circulating passages (30) for each of the CVD processing vacuum vessels are connected to a circulating pump having a temperature adjusting mechanism through piping (31), respectively (not shown). A gate valve (302) is provided between each of the vacuum vessels. At the center of the transferring vacuum vessel (304), there is provided a frog-leg type articulated robot (303) for transferring a substrate.

The frog-leg type articulated robot (303) comprises, on a base plate (305), arms (312), two substrate waiting stages (306) and (307), a substrate grasping mechanical hand (308) coupled to the arms (312). The substrate grasping mechanical hand (308) is provided with four nails (309) to grasp a substrate. Two substrate waiting stages (306) and (307) are located below a path (310) along which the substrate grasping mechanical hand (308) moves back and forth. On the substrate waiting stage (307), there is mounted an unprocessed substrate (53). The arms (312) are vertically movable so that a substrate can be placed on or picked up from the substrate waiting stage. The base plate (305) rotates on its own axis to rotate the frog-leg type articulated robot (303) as a whole. This rotary motion enables the frog-leg type articulated robot (303) to face each of the CVD processing vacuum vessels. The transferring method using the frog-leg type articulated robot (303) is as mentioned earlier. The subject matter of U.S. patent application Ser. No. 07/979,255 describes such a robot, and is hereby incorporated herein by reference.

The transferring method will be described using the integrated multi-chamber CVD processing system.

In this integrated module multi-chamber vacuum processing system, a substrate is transferred into one processing vacuum vessel, a gate valve between the processing vacuum vessel and vacuum vessel for transferring substrate is closed, the substrate is processed in the processing vacuum vessel. The processed substrate is then taken out and restored into the load/unload vacuum vessel to close the gate valve.

In one processing vacuum vessel, the above procedures are one working process. Throughout this period of time, the gate valves for the other processing vacuum vessels remain closed. According to these processing conditions, dust particles existing within one processing vacuum vessel do not contaminate the other processing vacuum vessels. Also, during this period, even if the gate valve is closed to isolate the processing vacuum vessel from the vacuum vessel for transferring substrate, it is possible to set an appropriate pressure within each of the processing vacuum vessels because each is preferably provided with a vacuum pump.

The use of such a frog-leg type articulated robot can greatly reduce the time to transfer a substrate. Moreover, since the number of movements of a baseplate to rotate the frog-leg type articulated robot can also be reduced, the amount of dust particles from the sliding portion can be also reduced. This is because in such a substrate transferring mechanism having a conventional mechanical hand to grasp only one substrate as disclosed in U.S. Pat. No. 4,951,601, the number of movements of the baseplate is three times when the transferring process from (a) to (b) is executed while it requires only double the time for such a frog-leg type articulated robot.

Moreover, a frog-leg type articulated robot may be used in which one substrate waiting stage and two mechanical hands are integrated with each other from behind for grasping one substrate. Moreover, a frog-leg type articulated robot may be used in which there is no substrate waiting stage, but only two mechanical hands integrated with each other from behind for grasping the substrates respectively.

Figure 25:
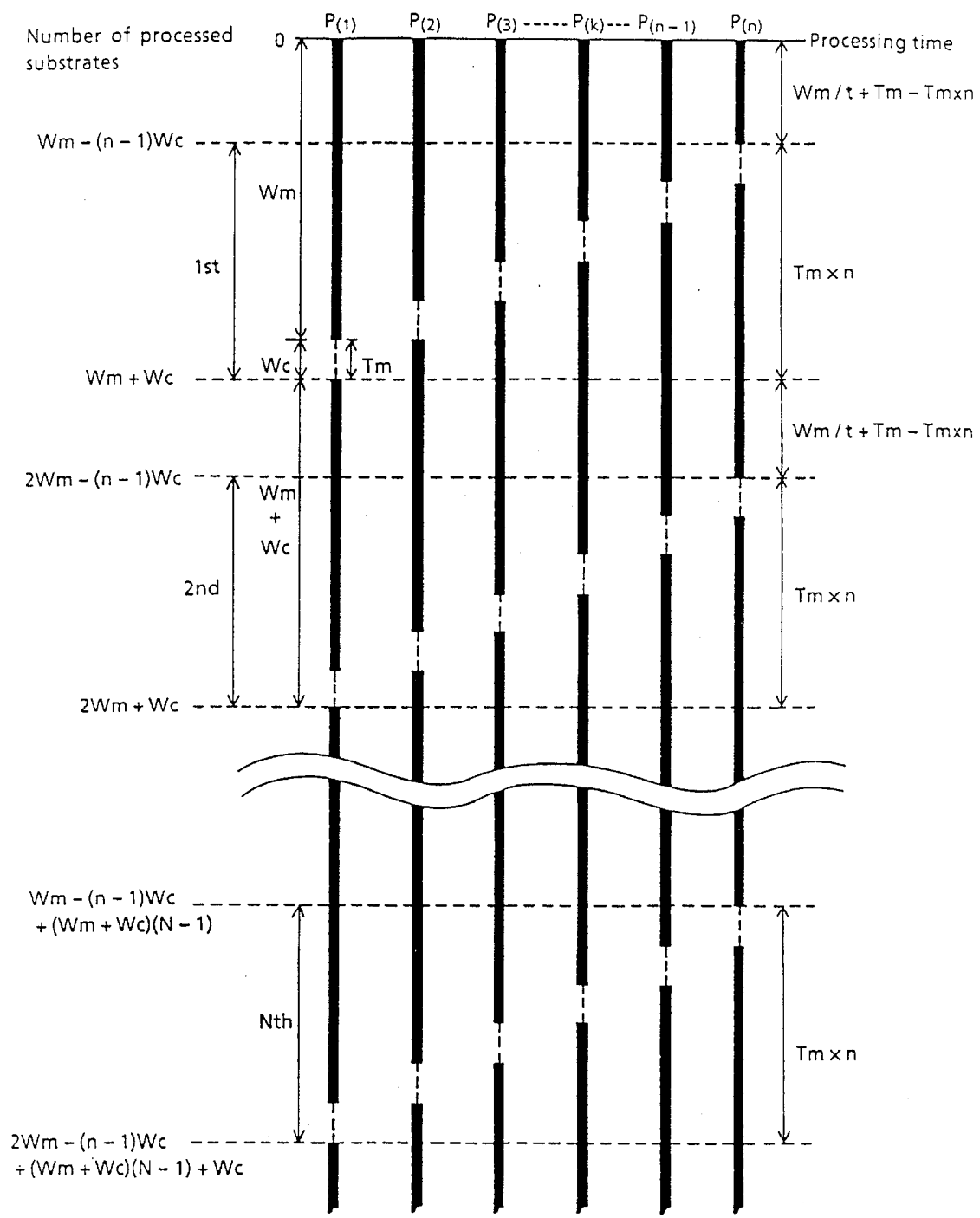
FIG. 25(a) is a table showing a number of processed substrates until maintenance work is reached in each of the CVD processing vacuum vessels.
FIG. 25(b) is a flow chart showing procedures in each of the CVD processing vacuum vessels.

With reference to FIG. 25 (*a*) and FIG. 25 (*b*), a description of a processing method will be made.

In the first step, n units of CVD processing vacuum vessels P(1), P(2), P(3), . . . , P(k), . . . , P(n−1), and P(n)(however, n≧3), start to process substrates at the same time.

In the second step, the first maintenance work is performed just after Wm substrates are processed in P(1), Wm-Wc substrates are processed in P(2), . . . , Wm-(k−1)Wc substrates in P(k), . . . , and Wm(n−1)Wc substrates in P(n), respectively.

The maintenance work for each of these CVD processing vacuum vessels is performed within maintenance work time Tm. Here, Wm means a predetermined number of substrates which are to be processed in one CVD processing vacuum vessel before the maintenance work is started. Hereafter, Wm will be referred to as the "standard number of substrates for the maintenance work." Wc can be derived from Wc=Tm/t. Tm represents the predetermined maintenance work time. t is the time which is required for a substrate to be transferred from the load/unload vacuum vessel, processed in the CVD processing vacuum vessel, and returned to the carrying load/unload vacuum vessel. Wc means the number of substrates which are processed in one of the CVD processing vacuum vessels while maintenance work is performed in another CVD processing vacuum vessel. Hereafter, Wc will be called the "standard number of substrates to be processed."

The first maintenance work period is started just after Wm-(n−1)Wc substrates are processed, and terminated just after Wm+Wc substrates are processed. The maintenance work period is Tm×n. During this period, Tm×n, n−1 substrates are processed every t hours.

In the third step, the second maintenance work is performed just after 2Wm+Wc substrates are processed in P(1), 2Wm substrates are processed in P(2), Wm-(k−1)Wc+(Wm+Wc) in P(k), . . . and Wm-(n−1)Wc+(Wm +Wc) in P(n), respectively.

The second maintenance work period is started just after 2 Wm-(n−1)Wc is processed, and terminated just after 2 Wm+Wc substrates are processed. The maintenance work period is Tm×n the same as the first maintenance work period.

In the N+1th step, the Nth maintenance work is performed first after Wm+Wc (Wm+Wc)(N−1) substrates are processed in P(1), Wm+(Wn+Wc)(N−1) substrates are processed in P (2), . . . , Wm-(k−1)Wc+(Wm+Wc)(N−1) substrates in P(k), . . . , and Wm-(n−1)Wc+(Wm+Wc)(N−1) substrates in P(n), respectively.

The Nth maintenance work period is started first after Wm−(n−1)Wc+(Wm+Wc)(N−1) substrates are processed, and terminated first after Wm+(Wm+Wc)(N−1)+Wc substrates are processed. The maintenance work period is Tm×n.

If the standard for maintenance work for each of the CVD processing vacuum vessels should be indicated in time instead of the number of substrates, the number of processed substrates can be divided by t.

With this method, n substrates are processed every t hours during a period in which no maintenance work is performed for any of the CVD processing vacuum vessels, that is, during a period Wm/t+Tm−Tm×n. In the maintenance work period Tm×n, (n−1) substrates are processed every t hours.

Since the maintenance work period can be reduced, as will be described later, this method can be effectively performed.

If the numerical value for a quotient obtained when Wm is divided by Wc is smaller than n units of the CVD processing vacuum vessels, the above processing method cannot be used. This means the maintenance work time is set for the long term. Therefore, if the maintenance work time Tm for many hours should be secured beforehand, the substrate is processed under the following conditions.

A maximum number Nu of usable processing vacuum vessels is derived from the following relational expression. The number of substrates to be processed Wc is derived from Wc=Tm/t, where the maintenance work time Tm is a predetermined time. The maximum number Nu of processing vacuum vessels to be used can be derived from Nu=Wm/Wc, where Nu≧2.

Moreover, n units of CVD processing vacuum vessels P(1), P(2), P(3), ... P(n−1) and P(n) are grouped every (Nu+1) units. Consequently, one group consists of (Nu+1) units of CVD processing vacuum vessels. Then, the number G of the group is derived from G=n/(Nu+1). At this juncture, the number of remaining CVD processing vacuum vessels is assumed to be R, where 0≦R<Nu+1.

This relational expression is used according to the following procedures.

Among the G groups, in a group of CVD processing vacuum vessels {GP(1), GP(2), ... , GP(Nu) and GP(Nu+1)}, (a) First, substrates are processed by the CVD processing vacuum vessels GP(1) to GP(Nu).

(b) When the standard number of substrates to be processed Wc derived from the above relational expression is reached, the processing by GP(1) is stopped. At the same time, processing in GP(Nu+1) is started while processing in GP(2) to GP(Nu) is continued. Then, when the standard number of substrates to be processed reaches 2×Wc, the processing in GP(2) is stopped to start processing by GP(1). This procedure is continued until the number of processed substrates reaches (Nu−1)×Wc by GP(Nu−1).

(c) When a predetermined standard number for maintenance work Wm is reached, the maintenance work is started by the CVD processing vacuum vessel GP(Nu).

(d) Maintenance work in GP(Nu) is performed within the maintenance work time Tm.

(e) Just after Tm, the maintenance work in GP(Nu+1) is started. A required period for the maintenance work is Tm. After the next Tm, the maintenance work in GP(1) is started. The maintenance work is repeated according to these procedures.

(f) The procedures from process (a) to process (c) are performed by each of these groups, simultaneously.

(g) In addition, while substrates are processed in the CVD processing vacuum vessels of each group, processing substrates in all the remaining CVD processing vacuum vessels RP is continued until the standard number for maintenance work Wm is reached. When the standard number for maintenance work Wm is reached, maintenance work is performed for all of R units of the CVD processing vacuum vessels. The maintenance work is performed within time The maintenance work for all of R units of CVD processing vacuum vessels must be performed at the same time as that for any one of each group of CVD processing vacuum vessels. In other words, the maintenance work for (R+G) units of CVD processing vacuum vessels must be performed, simultaneously.

According to this method, until the maintenance work for the remaining CVD processing vacuum vessels RP is performed, (Nu×G+R) substrates are processed every t hours. While the maintenance work for the CVD processing vacuum vessels RP is being performed, (Nu+G) substrates are processed every t hours.

In this respect, for GP(1) to GP(Nu) processing by which has been stopped every number Wc at the beginning, maintenance work may be performed until the next process is started. A period required for the maintenance work is Tm. Under the following conditions, the substrate processing and maintenance work can be efficiently performed by using these methods.

(a) It preferably should take a considerable period of time to process a substrate. These methods are not suitable for the process such as the sputtering and etching processes which can be performed in a short time. In a process which can be performed in a short time, a sufficient time for maintenance work is difficult to secure when any of these methods is used. Therefore, these methods are most suitable for a CVD process which requires a considerable period of time.

(b) There preferably should be three units or more of CVD processing vacuum vessels. In two processing vacuum vessels, substrate processing can be continuously performed without suspending the substrate processing during maintenance work. However, only one substrate can be processed during the maintenance work. During the maintenance work, the processing performance is the same as the single wafer processing type CVD processing apparatus. Simultaneous processing of a plurality of substrates, which is characterized by the integrated module multi-chamber CVD processing system, cannot be performed.

(c) A time required for transferring a substrate between a processing vacuum and a carrying in and out load/unload vacuum vessel should be as short as possible. If it takes much time to transfer, as the number of processed substrates increases, the plurality of substrates to be processed simultaneously will be deviated from the desired number. If the interval of the time of deviation becomes large, while maintenance work for one processing vacuum vessel is being performed, maintenance work for the next processing vacuum vessel will have to be started. To reduce the transferring time as much as possible, a frog-leg type articulated robot to store at least two substrates of the seventh means is the most suitable.

Each CVD processing vacuum vessel requires maintenance work after about 1,000 substrates are processed. It takes about 6 minutes for one unprocessed substrate to be fed from the carrying-in load-lock vacuum vessel (300), processed in a CVD processing vacuum vessel, and returned to the carrying-out load-lock vacuum vessel (301) as a processed substrate.

Under this condition, while maintenance work is being performed on one of the CVD processing vacuum vessels, a description is made of a method to process a substrate in another CVD processing vacuum vessel. The maintenance work usually requires about 5 hours in one CVD processing vacuum vessel. The standard number of processed substrates WC=Tm/t=5×60 (min)/6 (min/one sheet)=50.

Figure 22:
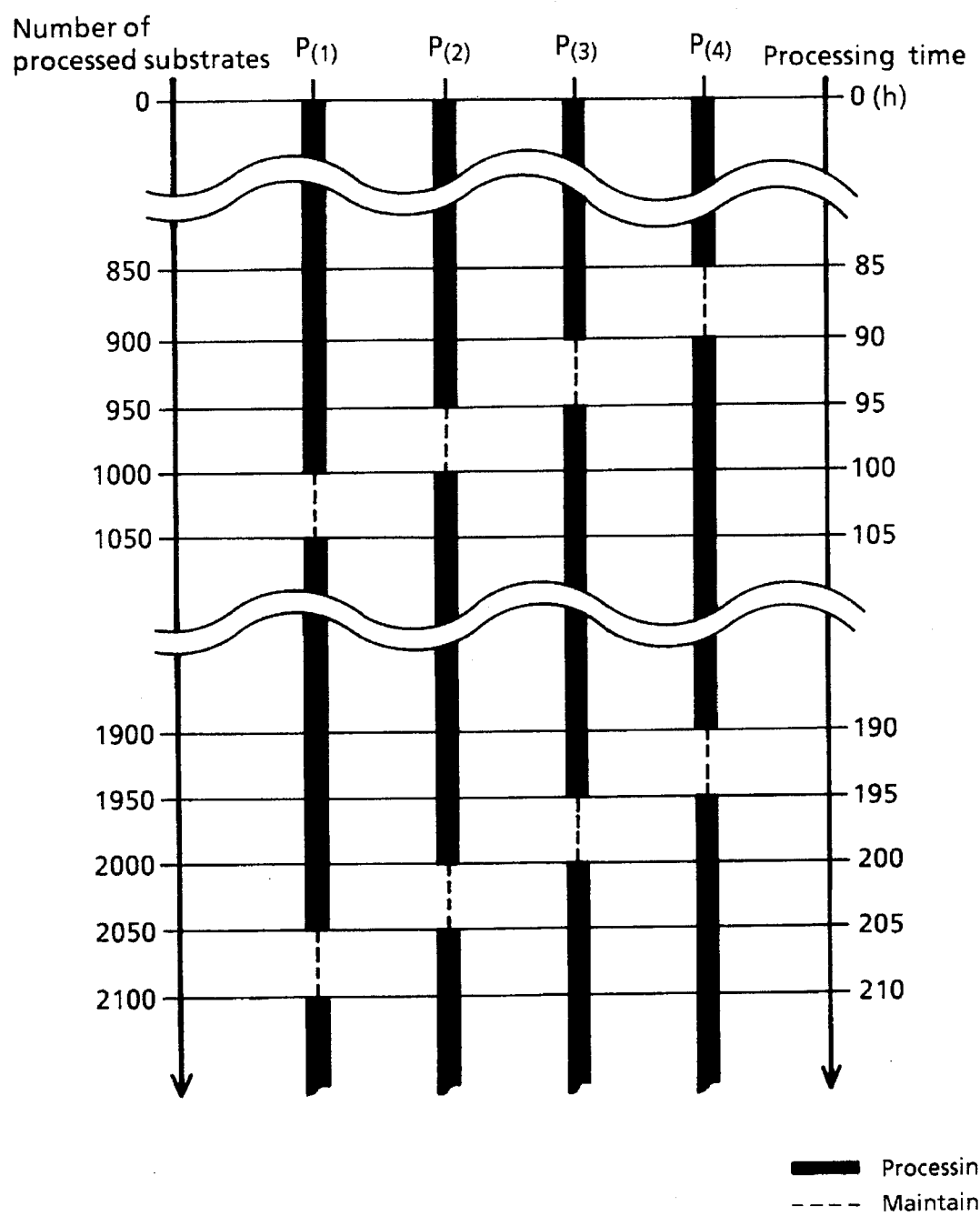
FIG. 22 is a flow chart showing procedures in each of the CVD processing vacuum vessels.

This method will be described with reference to FIG. 22.

At the beginning, substrates are transferred to P(1), P(2), P(3) and P(4) to process them. For the first maintenance work for the respective CVD processing vacuum vessels, when the number of substrates processed in P(4) reaches 850 sheets, that in P(3) 900 sheets, that in P(2) 950 sheets, and that in P(1) 1,000 sheets, the maintenance work begins. The first maintenance work period starts after 85 hours from the start of processing substrates, and is terminated after 105 hours. The time required for the maintenance work is 20 hours.

For the second maintenance work for the respective CVD processing vacuum vessels, when the number of substrates processed in P(4) reaches 1,900 sheets, that in P(3) 1,950 sheets, that in P(2) 2,000 sheets, and that in P(1) 2,050 sheets respectively, the maintenance work commences. The second maintenance work period starts after 190 hours from the start of processing substrates, and is terminated after 210 hours.

The above procedure is repeated.

According to this processing method, during 20 hours of the maintenance work period, three substrates are processed every 6 minutes.

A substrate processing method, if the maintenance work time should be set to 50 hours (about 2 days) beforehand is as follows: Number of processed substrates during maintenance Wc=300 (min)/6(min/one sheet)=500 (sheets), maximum number of usable vacuum vessels Nu=Wm/Wc=1,000 (sheets/unit)/500 (sheets)=2 (units). Number of groups G=n/(Nu+1)=4/3=1 (1 remains). If the maintenance work time is 50 hours for four CVD processing vacuum vessels, one group can be formed. One group is assumed to consist of {P(1), P(2), and P(3)}, and the remaining CVD processing vacuum vessel RP is assumed to be P(4).

Figure 23:
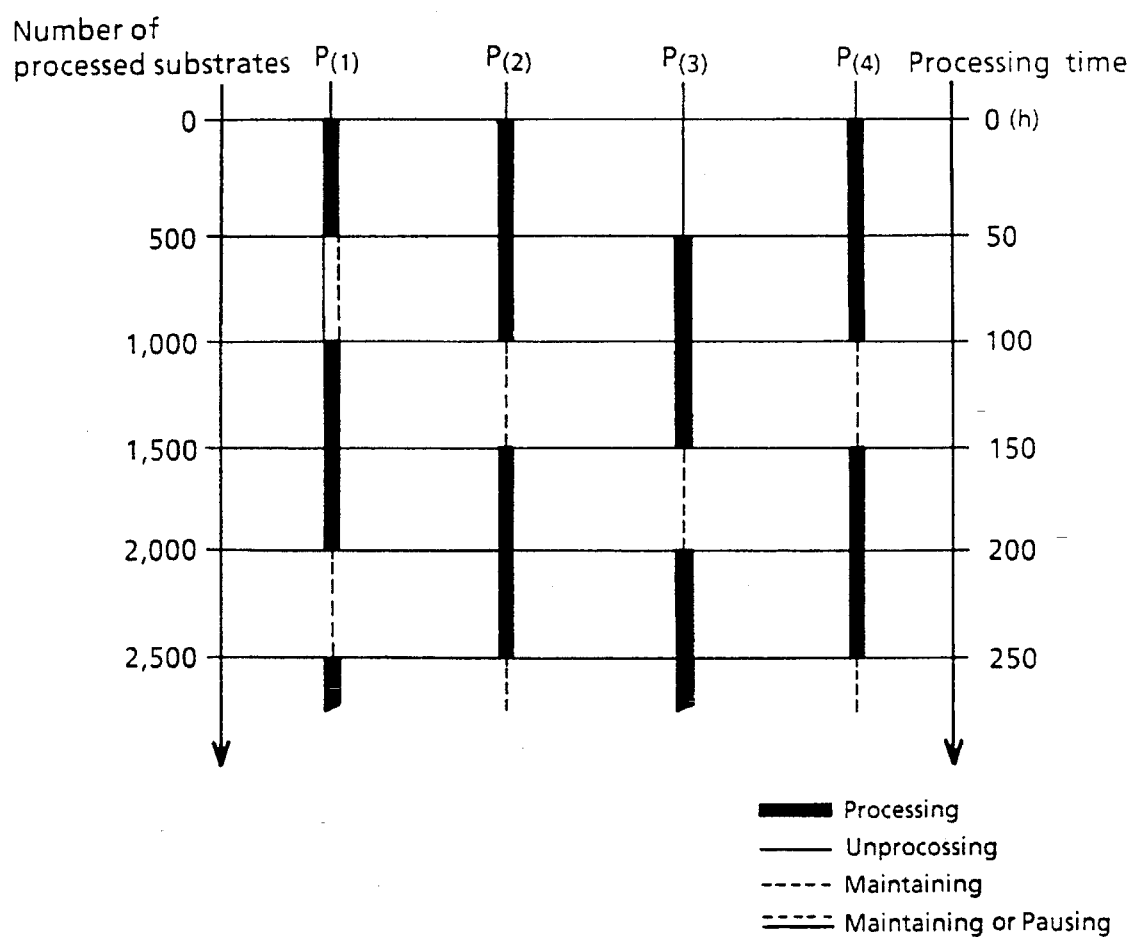
FIG. 23 is a flow chart showing procedures in each of the CVD processing vacuum vessels.

This method will be described with reference to FIG. 23. At the beginning, substrates are transferred to P(1), P(2), and P(4) to process them. When a number of processed substrates reaches 500 sheets, processing work in P(1) is stopped. At the same time, the substrates are transferred to P(3) to start processing. Substrates to be processed are transferred to P(2), P(3) and P(4). When a number of processed substrates in P(2) and P(4) reaches 1,000 sheets, processing work in P(2) and P(4) is stopped to start the maintenance work. The moment the processing in P(2) is stopped, processing work in P(1) is started. While substrates are being processed in P(3) and P(1), the maintenance work for P(2) and P(4) is carried out. When a number of substrates processed in P(3) reaches 1,000 sheets, the processing work P(3) is stopped to start the maintenance work. The moment the processing work in P(3) is stopped, P(2) and P(4) are resumed. While substrates are being processed by P(1), P(2) and P(4), the maintenance work for P(3) is performed. This procedure is repeatedly carried out.

According to this method, three substrates are processed about every 6 minutes during the period from the start of processing work to 100 hours. Two substrates are processed about every 6 minutes during the period from the next 100 to 150 hours. Then, three substrates are processed about every 6 minutes during the period from the next 150 to 250 hours. During 100 hours in which substrates are being processed by the remaining CVD processing vacuum vessel P(4), substrates are processed at a rate of three sheets about every 6 minutes. During 50 hours in which P(4) is suspended due to the maintenance work, substrates are processed at the rate of two sheets about every 6 minutes. In other words, three substrates are processed about every 6 minutes during the 100 hours period while two substrates about every 6 minutes during the next 50 hours period.

In this respect, for P(1) the operation of which was suspended after 500 sheets at the beginning are processed, maintenance work is carried out until the next process begins. The period required for the maintenance work is 50 hours.

If CVD processing vacuum vessels are five, they are grouped into one group and two remaining CVD processing vacuum vessels. One group is assumed to be {P(1), P(2) and P(3)}, and the remaining CVD processing vacuum vessels RP are assumed to be P(4) and P(5). For the period until maintenance work is performed in P(4) and P(5), that is, during the period from the start of processing to 100 hours, four substrates are processed about every 6 minutes. During the period in which maintenance work for P(4) and P(5) is being performed, that is, during the period from the next 100 to 150 hours, two substrates are processed about every 6 minutes.

If CVD processing vacuum vessels are six, they are grouped into two groups. {P(1), P(2) and P(3)} is regarded as one group, {P(4), P(5) and P(6)} is regarded as the other group. In this cases, four substrates are continuously processed about every 6 minutes.

Figure 24:
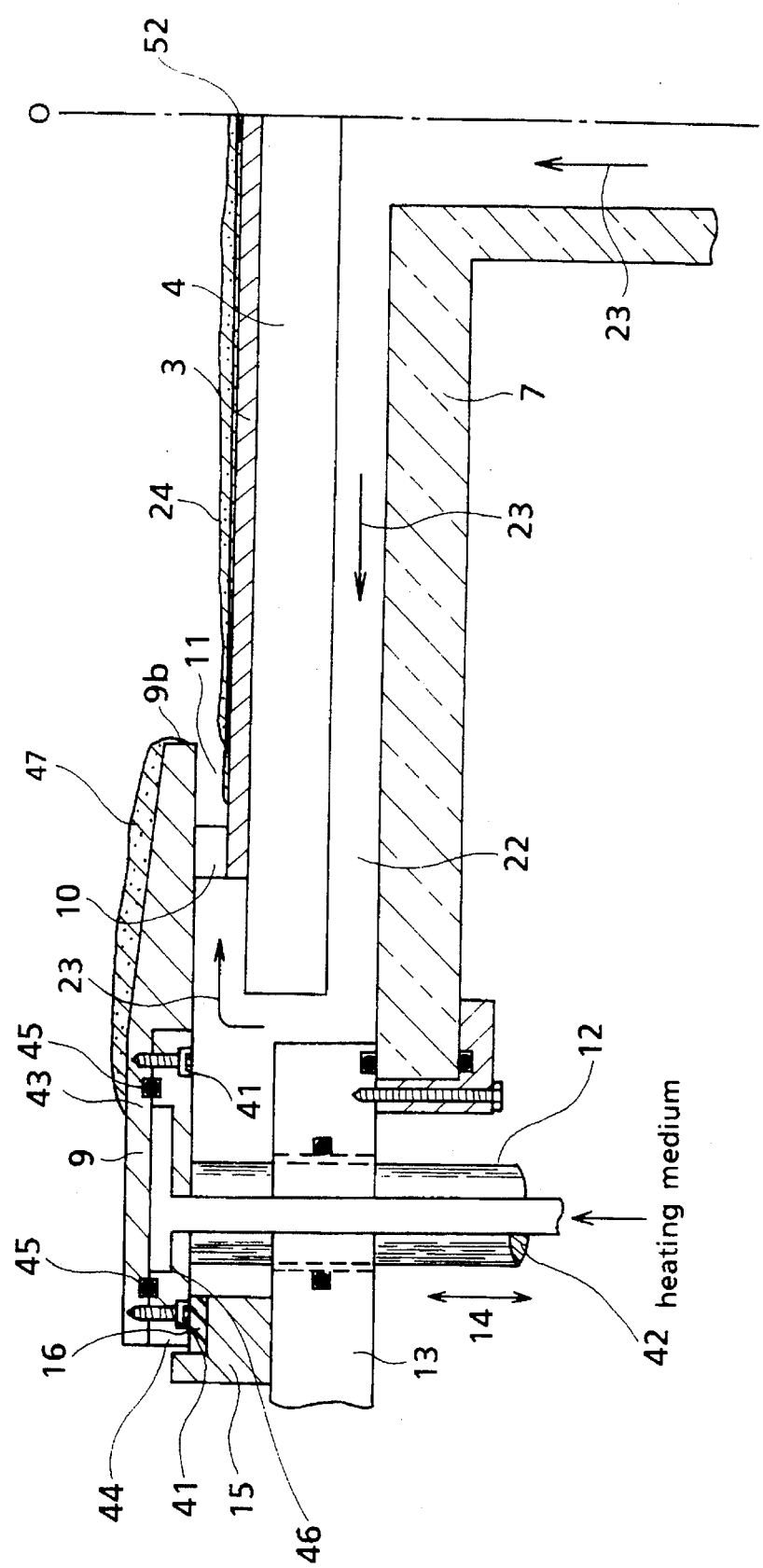
FIG. 24 is a view showing a ring chuck consisting of a pedestal and canopy top.

To clean the interiors within a CVD processing vacuum vessel more easily the ring chuck is divided into two portions as shown in FIG. 24. The ring chuck (9) is assembled by affixing a canopy-like portion (43) for covering the substrate (3) on a pedestal-like portion (44) coupled to a prop (12) with hexagon socket head bolts (41). The surface of the canopy-like portion (43) is exposed to reactive gas. For this reason, a W film (47) is deposited only on the surface of the canopy-like portion (43) as shown in FIG. 24. Accordingly, when the ring chuck (9) is cleaned, it will be sufficient for cleaning work to replace the canopy-like portion with a new one.

Further, a recess (46) is formed on the pedestal-like portion (44), and this recess (46) serves as a passage for a heating medium flowing within the ring chuck (9) to heat the ring chuck (9). By heating the ring chuck (9), heat transfer between the ring chuck (9) and the substrate (3) is minimized, The heating medium is heated to not higher than about 200° C. The temperature of the heating medium of higher than 200° C. is not preferable because it promotes deposition of the W film on the ring chuck (9). The heating medium is not a coolant because the heat transfer from the substrate (3) to the ring chuck (9) is promoted, if the heating medium is a coolant. Promoting the heat transfer makes the temperature distribution on the substrate (3) nonuniform. The temperature of the heating medium is suitable within the range of from 70° C. to 200° C. The ring chuck (9) at more than 70° C. prevents HF gas as a by-product from being absorbed on the surface of the ring chuck (9). As for the heating medium, there are inert gases such as Ar gas and $N_2$ gas, oil and water. In particular, an inert gas is preferable. An inert gas does not affect the CVD reaction even if it leaks into a vacuum vessel. In addition, when the canopy-like portion (43) of the ring chuck (9) is removed in cleaning, the inert gas as a heating medium does not remain in the recess (46), thus not spilling into the vacuum vessel. The heating medium does not adhere to the inner wall and other parts during the cleaning.

Between the hexagon socket head bolt (41) and the recess (46), a groove is formed, where a rubber O-ring (45) made of fluorocarbon rubber is affixed. The rubber 0-ring (45) prevents the heating medium from leaking into the vacuum vessel. Piping (42), passing through the interior of the prop (12), is coupled with the recess (46) at a position where the prop (12) is coupled to the pedestal-like portion (44). Since the heating medium is circulated in the ring chuck (9), the ring chuck (9) is heated. Since the temperature difference between the substrate (3) and the point contact (10) becomes small, it is possible to suppress the transfer of the amount of heat due to the temperature difference. Therefore, it is possible to prevent the temperature at the edge portion of the substrate (3) from dropping.

As a major cause for producing dust particles, except for micro-peeling, the peeling phenomenon of film deposited on the constituent elements other than on the substrate within the reaction vessel is considered. Thus, to prevent film deposited on constituent elements other than the substrate within the reaction vessel from being peeled off, the exposed portion of the ring-shaped member will be exposed to the reactive gas and other portions. In this case, the material of the surface of the ring-shaped member facing the space where the chemical reaction occurs is made the same as that of the thin film to be deposited on the substrate. When $WF_6$ and $H_2$ react with each other to deposit a W film on the substrate, the temperature on the surface must be about 200° C. or higher to deposit a W film by the chemical reaction. It is in the ring-shaped member that the temperature becomes at most 200° C. except for the substrate.

For this reason, a W film is deposited only on the surface of the ring-shaped member. The cause of peeling off of the W film deposited there is an internal stress generated by the difference in thermal expansion between the ring-shaped member and the W film deposited on it. When the W film deposited on the ring-shaped member grows to such a film thickness as to generate internal stress due to the difference in thermal expansion between the ring-shaped member and W film deposited on it, peeling off occurs. The peeling off of small pieces as dust particles causes the yield to be decreased. For the material of the exposed portion of the ring-shaped member, tungsten is used not to generate any internal stress due to the difference in thermal expansion in the W film deposited on the exposed portion of the ring-shaped member. Or it may be possible to coat a W film on the surface of the exposed portion of the ring-shaped member beforehand. Moreover, for the exposed portion of the ring-shaped member, it may be possible to use material having the same thermal expansion coefficient as the film to be deposited. For the W film, an alloy of nickel and copper on sale as a brand "MONEL" metal is optimum.

Thus, the canopy-like portion (43) is made of tungsten or an alloy of nickel with "MONEL" metal and copper. None of these materials generates dust particles even if film deposited on the canopy-like portion (43) made of these materials is thicker than the film deposited on one made of stainless steel because it has the same thermal expansion coefficient as the W film. For this reason, the number of substrates processed until the maintenance work is reached can be increased more than with a ring chuck made of stainless steel.

According to the present invention, in an integrated module multi-chamber CVD processing system which performs deposition of blanket tungsten film, it is possible to attain good film uniformity; no fine peeling due to micro-peeling occurs even if the ring chuck is separated from the substrate after depositing a tungsten film on the substrate; and the occurrence of fine dust particles is suppressed to attain a high yield. It is also possible to create a shadow region with a definite shape, so as to stop the occurrence of any dust particles, and therefore, a high yield can be achieved. Also, according to the present invention, in the processing method of an integrated module multi-chamber CVD processing system, it is possible to continuously perform film deposition without suspending the operation of the system during the maintenance work.

The principles, preferred embodiments, and modes of operation of the present invention have been described in the foregoing specification. However, the invention which is intended to be protected is not to be construed as limited to the particular embodiments disclosed. The embodiments are therefore to be regarded as illustrative rather than restrictive. Variations and changes may be made by others without departing from the spirit of the present invention. Accordingly, it is expressly intended that all such equivalents, variations and changes which fall within the spirit and scope of the present invention as defined in the claims be embraced thereby.

What is claimed is:

1. A CVD processing apparatus comprising:

a reaction vessel having a window made of light-transmissive material;

a substrate holder for holding a substrate in a fixed position, said substrate holder having a backside and is arranged within the reaction vessel such that the backside faces the window;

a ring-shaped member to affix the substrate in the fixed position on the substrate holder;

reactive gas supply means for supplying reactive gas into the reaction vessel;

a plurality of heating means which are arranged at the backside of the substrate holder and outside the reaction vessel;

a purge gas supply means for supplying purge gas from the backside of the substrate holder;

an exhaust means for exhausting the reaction vessel;

a center of the fixed position is positioned at a central axis of the ring-shaped member;

an innermost diameter of the ring-shaped member is smaller than a diameter of the substrate;

the ring-shaped member has at least three contact members for contacting the substrate and a ring-shaped portion, said contact members and ring-shaped portion being arranged such that only the contact members, and not the ring-shaped portion contact the substrate;

a side of each of the contact members that is arranged facing the central axis of the ring-shaped member is located on a circumference of a concentric circle having a diameter larger than the innermost diameter of the ring-shaped member; and within the reaction vessel, there are passages in which the purge gas flows between the window and the substrate holder, between the substrate holder and the ring-shaped member, and between the ring-shaped member and the substrate.

2. The CVD processing apparatus according to claim 1, wherein the innermost diameter of the ring-shaped member is shorter than a diameter of a region on which a thin film is formed on the substrate.

3. The CVD processing apparatus according to claim 2, wherein a radius of the concentric circle where the side of the contact member facing the central axis of the ring-shaped member is positioned is longer than the longest distance between the central axis of the ring-shaped member and the thin film region formed on the substrate.

4. The CVD processing apparatus according to claim 2, wherein the thin film deposited on the substrate is one of a TiN film and a TiW film.

5. The CVD processing apparatus according to claim 1, wherein an outer side of each of the contact members is arranged at such a position so as to true up with an outer side of the substrate in the fixed position.

6. The CVD processing apparatus according to claim 1, wherein the side of said each of the contact members is a curved surface.

7. The CVD processing apparatus according to claim 6, wherein each of the contact members is a column.

8. The CVD processing apparatus according to claim 6, wherein a cross-sectional shape of each of the contact members is elliptical, and a major axis of the elliptical shape is parallel to a direction of a flow of the purge gas.

9. The CVD processing apparatus according to claim 8, wherein the major axis of each said of the contact members is less than a quarter of the difference between the innermost diameter of the ring-shaped member and the diameter of the substrate.

10. The CVD processing system according to claim 6, wherein a bottom of said each of the contact members in contact with the substrate is a curved surface.

11. The CVD processing apparatus according to claim 6, wherein a bottom of said each of the contact members in contact with the substrate is pin-shaped.

12. The CVD processing apparatus according to claim 1, wherein a longest distance in cross-section of said each of the contact members is less than a quarter of the difference between the innermost diameter of the ring-shaped member and a diameter of the substrate.

13. The CVD processing apparatus according to claim 12, wherein a diameter in the cross-section of the contact members is less than said quarter of the difference between the innermost diameter of the ring-shaped member and the diameter of the substrate.

14. The CVD processing apparatus according to claim 1, wherein Ar gas in used as the purge gas and its flow rate is 300 sccm, the difference between the innermost diameter of the inner circle of the ring-shaped member and a diameter of the substrate is 3 mm, the height of the contact members is 0.2 to 0.3 mm, and the longest distance of the cross-section of the contact portion is 1.0 to 1.5 mm.

15. The CVD processing apparatus according to claim 1, wherein there are twelve contact members and the substrate is eight inches in diameter.

16. The CVD processing apparatus according to claim 1, wherein the ring-shaped member includes an exposed portion that is exposed to the reactive gas, and an other portion.

17. The CVD processing apparatus according to claim 16, wherein the exposed portion is a canopy-like portion which covers the substrate, and the other portion is a pedestal-like portion coupled to a prop.

18. The CVD processing apparatus according to claim 17, wherein the canopy-like portion is made of the same material as a thin film deposited on the substrate.

19. The CVD processing apparatus according to claim 18, wherein the thin film deposited on the substrate is a tungsten thin film, and the canopy-like portion is made of tungsten.

20. The CVD processing apparatus according to claim 17, wherein the canopy-like portion is made of a material having the same thermal expansion coefficient as a thin film deposited on the substrate.

21. The CVD processing apparatus according to claim 20, wherein the thin film deposited on the substrate is made of tungsten, and the canopy-like portion iS made of "MONEL" metal.

22. The CVD processing apparatus according to claim 17, wherein in the canopy-like portion, a recess is formed which is connected to piping for supplying a heating medium.

23. The CVD processing apparatus according to claim 1, wherein the contact members are disposed at an equal pitch.

24. The CVD processing apparatus according to claim 1, wherein the contact members contact a portion of the substrate on which a thin film is not formed.

25. A CVD processing apparatus, comprising:

a reaction vessel having a window made of a light transmissive material;

a substrate holder for holding a substrate in a fixed position, said substrate holder having a backside and is arranged within the reaction vessel such that the backside faces the window;

a ring-shaped member to affix the substrate on the substrate holder with at least three contact members;

reactive gas supply means for supplying reactive gas into the reaction vessel;

a plurality of heating means which are arranged outside the reaction vessel for heating the substrate holder by irradiating light to the backside of the substrate holder through the window;

purge gas supply means for supplying a purge gas to the backside of the substrate holder;

exhaust means for exhausting the reaction vessel;

each of the heating means has a power control means;

each of the heating means is located outside of a periphery of a contact portion where the ring-shaped member contacts the substrate;

a region of a surface of the substrate holder having a higher temperature than an average temperature of the surface of the substrate is cut to a depth proportional to the difference between the temperature at the region and the average substrate temperature to form a stepped portion; and within the reaction vessel are passages in which the purge gas flows between the window and the substrate holder, between the substrate holder and the ring-shaped member, and between the ring-shaped member and the substrate.

26. The CVD processing apparatus according to claim 25, wherein each of the heating means are a lamp heaters.

27. The CVD processing apparatus according to claim 26, wherein the ring-shaped member includes twelve contact members arranged on a circumference of the substrate at an equal pitch, and the lamp heaters are arranged behind the twelve contact members, respectively.

28. The CVD processing apparatus according to claim 25, wherein the window is made of silica glass.

29. The CVD processing apparatus according to claim 25, wherein the substrate holder is made of a material having thermal conductivity.

30. The CVD processing apparatus according to claim 29, wherein the substrate holder is made of a material selected from the group consisting of aluminum, carbon and copper.

31. The CVD processing apparatus according to claim 29, wherein the substrate holder is made of aluminum, and Ar gas is used as the purge gas.

32. The CVD processing apparatus according to claim 29, wherein the substrate holder is made of Ar gas is used as the purge gas, a diameter of the substrate is eight inches, the surface of the aluminum substrate holder in contact with the substrate is step-machined to provide an annular stepped area having an outside diameter of 170 mm, an inside diameter of 80 mm, and a depth of 0.1 mm.

33. The CVD processing apparatus according to claim 29, wherein the substrate holder is made of aluminum, Ar gas is used as purge gas, a diameter of the substrate is six inches, the surface of the substrate holder in contact with the substrate is step-machined to provide an annular stepped area having an outside diameter of 120 mm, an inside diameter of 60 mm, and a depth of 0.1 mm.

34. The CVD processing apparatus according to claim 29, wherein in the surface of the substrate holder in contact with the substrate, a lower sheet resistivity region of the surface of the substrate holder having a lower sheet resistivity than an average sheet resistivity of a W film deposited on the surface of the substrate is cut off at a depth proportional to the difference between the lower sheet resistivity at the lower sheet resistivity region and the average sheet resistivity to form a stepped portion.

35. The CVD processing apparatus according to claim 29, wherein there are passages for a heating medium which flows within the ring-shaped member.

36. The CVD processing apparatus according to claim 35, wherein a temperature of the heating medium is not higher than temperatures at which a film starts to be formed by a CVD process.

37. The CVD processing apparatus according to claim 36, wherein the heating medium has a temperature not higher than 200° C.

38. The CVD processing apparatus according to claim 35, wherein the heating medium is selected from the group consisting of water, oil and an inert gas.

39. The CVD processing apparatus according to claim 38, wherein the inert gas is one of Ar gas and $N_2$ gas.

40. A CVD processing apparatus, comprising:

a reaction vessel;

reactive gas supply means for supplying reactive gas into the reaction vessel;

a substrate holder for holding a substrate within the reaction vessel;

a ring-shaped member to contact a first surface of the substrate in order to hold a second surface of the substrate in a fixed position against a surface of the substrate holder; and a region of the surface of the substrate holder having a higher temperature than an average temperature of the substrate is cut to form a stepped portion;

wherein the region of the surface of the substrate holder is cut to a depth that is proportional to a difference between the temperature at the region and the average temperature.

41. The CVD processing apparatus of claim 40, wherein the ring-shaped member includes a plurality of contact members for contacting said first surface of the substrate at discrete locations.

42. A CVD processing apparatus, comprising:

a reaction vessel having a window made of light-transmissive material a substrate holder for holding a substrate in a fixed position, said substrate holder having a backside and is arranged within the reaction vessel such that the backside faces the window;

a ring-shaped member to affix the substrate in the fixed position on the substrate holder;

reactive gas supply means for supplying reactive gas into the reaction vessel;

a plurality of heating means which are arranged in a zone at the backside of the substrate holder and outside the reaction vessel for heating the substrate holder; and a plurality of power controllers, wherein each of said heating means within said zone has a respective power controller for separately controlling electric power to the heating means.

43. The CVD processing apparatus of claim 42, wherein the ring-shaped member includes a plurality of contact members for contacting said substrate at discrete locations.

44. The CVD processing apparatus of claim 43, wherein the heating means are located at positions corresponding to the discrete locations.

45. The CVD processing apparatus of claim 44, wherein the heating means are lamp heaters.

46. The CVD processing apparatus of claim 42, wherein a region of a surface of the substrate holder corresponding to a region at a higher temperature than an average temperature of the substrate is cut to form a stepped portion.

47. The CVD processing apparatus of claim 46, wherein the corresponding region of the surface of the substrate holder is cut to a depth proportional to a difference between the temperature at the region and an average substrate temperature.

48. The CVD processing apparatus according to claim 42, wherein the zone comprises an area substantially along a periphery of a circle.

49. The CVD processing apparatus according to claim 42, wherein said plurality of heating means are resistance heaters.

50. The CVD processing apparatus according to claim 49, wherein said plurality of heating means are lamps.

51. A CVD processing apparatus, comprising:

a reaction vessel;

reactive gas supply means for supplying reactive gas into the reaction vessel;

a substrate holder for holding a substrate within the reaction vessel; and a ring-shaped member for contacting a first surface of the substrate in order to hold a second surface of the substrate in a fixed position against a surface of the substrate holder, said ring shaped member comprises a canopy-like portion and a pedestal-like portion, wherein said canopy-like portion is replaceable separately from said pedestal-like portion.

52. The CVD processing apparatus of claim 51, wherein the pedestal-like portion is arranged within the vessel at a location so as to minimize film deposition thereon.

53. The CVD processing apparatus of claim 51, wherein the ring-shaped member includes a channel for conducting a heating medium.

54. The CVD processing apparatus of claim 51, wherein the pedestal-like portion includes a plurality of contact members for contacting said substrate at discrete locations.

55. The CVD processing apparatus of claim 51, wherein the canopy-like portion is comprised of a material having a coefficient of thermal expansion that is similar to the coefficient of thermal expansion of a film material that is being deposited by a CVD process.

56. In a CVD processing apparatus having a reaction vessel; reactive gas supply means for supplying reactive gas into the reaction vessel; a substrate holder for holding a substrate within the reaction vessel; a ring-shaped member for contacting a first surface of the substrate in order to hold a second surface of the substrate in a fixed position against a surface of the substrate holder, said ring shaped member comprising a canopy-like portion and a pedestal-like portion, wherein said canopy-like portion is replaceable separately from said pedestal-like portion, a method of servicing the reaction vessel that includes replacing the canopy-like portion while leaving the pedestal-like portion for continued use.

57. A CVD processing apparatus, comprising:

a reaction vessel;

reactive gas supply means for supplying a reactive gas into the reaction vessel;

a substrate holder for holding a substrate within a fixed area within the reaction vessel;

a ring-shaped member to contact a first surface of the substrate in order to hold a second surface of the substrate in a fixed position against a surface of the substrate holder;

the ring-shaped member includes a plurality of contact members extending from a base of the ring-shaped member for contacting said first surface of the substrate at discrete locations and maintaining said substrate at a distance from the base of the ring-shaped member; and means for creating a boundary between a central portion of said substrate that reacts with said reactive gas and an outer peripheral portion of said substrate that does not react with said reactive gas, said creating means includes means for controlling a purge gas supply for supplying a purge gas between the substrate and the base of the ring-shaped member in accordance with the distance and a size of the boundary in order to prevent the reactive gas from contacting the outer periphery of said substrate.

58. The CVD processing apparatus of claim 27, wherein each of said contact members includes a bottom face, and the contact members are arranged such that the entire bottom face of each of the contact members contacts the substrate.

59. The CVD processing apparatus of claim 57, wherein an outside edge of each of said contact members is in alignment with an outside edge of said substrate.

* * * * *